(12) United States Patent
Hao et al.

(10) Patent No.: US 11,616,456 B2
(45) Date of Patent: Mar. 28, 2023

(54) MICRO-DISPLACEMENT AMPLIFYING APPARATUS AND AMPLIFICATION METHOD THEREOF

(71) Applicants: BAOTOU RESEARCH INSTITUTE OF RARE EARTHS, Baotou (CN); Ruike National Engineering Research Centre of Rare Earth Metallurgy and Functional Materials Co., Ltd., Baotou (CN)

(72) Inventors: Hongbo Hao, Baotou (CN); Yu Qiao, Baotou (CN); Guangrui Zhang, Baotou (CN); Yuping Liang, Baotou (CN); Tingting Wang, Baotou (CN); Zhiqiang Li, Baotou (CN); Jin Li, Baotou (CN); Ruonan Tian, Baotou (CN)

(73) Assignees: BAOTOU RESEARCH INSTITUTE OF RARE EARTHS, Baotou (CN); Ruike National Engineering Research Centre Co., Ltd, Baotou (CN)

( * ) Notice: Subject to any disclaimer, the term of this patent is extended or adjusted under 35 U.S.C. 154(b) by 305 days.

(21) Appl. No.: 17/159,429

(22) Filed: Jan. 27, 2021

(65) Prior Publication Data
US 2021/0152103 A1 May 20, 2021

Related U.S. Application Data

(63) Continuation of application No. PCT/CN2020/076120, filed on Feb. 21, 2020.

(30) Foreign Application Priority Data

Aug. 5, 2019 (CN) .......................... 201910715674.2
Aug. 5, 2019 (CN) .......................... 201910715676.1

(Continued)

(51) Int. Cl.
*H02N 2/04* (2006.01)
*H02N 2/00* (2006.01)

(52) U.S. Cl.
CPC ............. *H02N 2/043* (2013.01); *H02N 2/005* (2013.01)

(58) Field of Classification Search
CPC ......... H02N 2/043; H02N 2/005; H01L 41/12
See application file for complete search history.

(56) References Cited

U.S. PATENT DOCUMENTS 5,287,761 A * 2/1994 Fujii ........................ G12B 1/00
359/393

* cited by examiner

*Primary Examiner* — Emily P Pham

(57) ABSTRACT

A micro-displacement amplifying apparatus comprises two sets of asymmetrical amplifying structures; each set of asymmetrical amplifying structure comprises a plurality of asymmetrical amplifying units connected in series by flexible hinges; the asymmetrical amplifying unit is used for amplifying a micro-displacement; the two sets of asymmetrical amplifying structures are in opposite positions and overlap with each other; the input end and output end are coupled to the asymmetrical amplifying unit by a flexible hinge, respectively; the input end is used for inputting the micro-displacement to the asymmetrical amplifying unit, and the output end is used for outputting the amplified displacement; the two contacting input ends are fixed and coupled to each other, and the two contacting output ends are fixed and coupled to each other. The present disclosure further discloses an amplification method of the micro-displacement amplifying apparatus.

16 Claims, 17 Drawing Sheets

(30) Foreign Application Priority Data

| Aug. 5, 2019 | (CN) | 201910715677.6 |
| Aug. 5, 2019 | (CN) | 201910715678.0 |
| Aug. 5, 2019 | (CN) | 201910715679.5 |
| Aug. 5, 2019 | (CN) | 201910715681.2 |
| Aug. 5, 2019 | (CN) | 201910715687.X |
| Aug. 5, 2019 | (CN) | 201910715691.6 |

MICRO-DISPLACEMENT AMPLIFYING APPARATUS AND AMPLIFICATION METHOD THEREOF

CROSS-REFERENCE TO RELATED APPLICATIONS

The application is a continuation of International Application No. PCT/CN2020/076120, filed Feb. 21, 2020, which claims priority to Chinese patent applications No. 201910715677.6, filed Aug. 5, 2019, No. 201910715674.2, filed Aug. 5, 2019, No. 201910715687.X, filed Aug. 5, 2019, No. 201910715681.2, filed Aug. 5, 2019, No. 201910715678.0, filed Aug. 5, 2019, No. 201910715676.1, filed Aug. 5, 2019, No. 201910715691.6, filed Aug. 5, 2019 and No. 201910715679.5, filed Aug. 5, 2019, the entire contents of which are incorporated herein by reference.

TECHNICAL FIELD

The present disclosure relates to MEMS-nano (micro-electro-mechanical system nano) technology, in particular to a micro-displacement amplifying apparatus and an amplification method thereof.

BACKGROUND

The MEMS-nano technology is an abbreviation for micro-electro-mechanical system (MEMS) technology and nano science and technology (nano ST).

Precision platforms using drivers of magnetostrictive materials can be widely used in the field of MEMS-nano technology. In fields that need lower output ranges, such as below 100 μm, or under environments where the volume of the driver is not limited, the magnetostrictive driver can complete the motion alone without the need of an auxiliary equipment, but in fields that need larger outputs and/or under environments where the volume of the driver is limited, the magnetostrictive driver alone cannot complete the work. Therefore, there is a need for a device for amplifying the displacement output by the driver.

A flexible hinge is a mechanical transmission and support apparatus developed after 1960, which is a new arc-shaped hinge with an integrated hinge-rod structure and belongs to a reversible elastic structure. The flexible hinge produces an obvious elastic angular deformation under the action of torque, which can act as the hinge in mechanical structures and which is characterized by zero friction, zero gap and high motion resolution. It can be used as the transmission structure of a micro-displacement amplifying apparatus, which can ensure the working precision and output stiffness at the same time and are widely used in the fields such as precision machinery, precision measurement, micro technology, nano technology and the like.

The working principle of a flexible displacement amplifying apparatus is to carry out motion based on the elastic deformation of the flexible hinge. In order to avoid errors caused by parasitic movement and temperature load, the configuration of the apparatus mostly adopts an axisymmetrical design. However, such design has problems: In order to achieve a symmetrical structure without changing the volume of the amplifying apparatus, only one-half of the transverse structure is effective for the magnification, while in order to achieve the magnification, the whole transverse structure has to be doubled. Therefore, under the working conditions of achieving both a small volume and a large magnification, the application of the flexible displacement amplifying apparatus is limited.

Chinese Patent CN104900573B discloses a symmetrical differential-lever micro-displacement amplifying device comprising a pedestal, a base plate fixed on the pedestal and a piezoelectric block, which is located at the same plane as the base plate. The piezoelectric block has a top pressing part and two transmission parts that are respectively arranged at the two ends of the top pressing part and are arranged symmetrically by using the midperpendicular of the top pressing part as the center; each of the two transmission parts is respectively coupled to a set of lever assemblies located at the same plane as the base plate, and the two sets of lever assemblies are arranged symmetrically by using the midperpendicular of the top pressing part as the center; between the two transmission parts, a piezoelectric ceramic driver is arranged against the top pressing part. By setting the lever assemblies, the amplification of displacement is achieved based on the principle of differential-lever amplification. This amplifying apparatus is axisymmetrical and large in volume, and the driver needs to be placed inside the amplifying apparatus, which is not suitable for environments where the volume of the driver is limited.

Chinese Patent Application Publication CN108109671A discloses a two-stage displacement amplifying apparatus based on a rhombic flexible apparatus comprising a primary rhombic flexible apparatus, a fixing frame and a secondary rhombic flexible apparatus. The primary rhombic flexible apparatus is fixed in the fixing frame, the two primary rigid input ends of the primary rhombic flexible apparatus are coupled to two opposite inner sides of the fixing frame through a guiding apparatus, and the rigid output ends of the primary rhombic flexible apparatus are coupled to the other two inner sides of the fixing frame through a centering apparatus. The two secondary rigid input ends of the secondary flexible apparatus are coupled to the two primary rigid output ends of the primary rhombic flexible apparatus, respectively, and the secondary rigid output ends of the secondary flexible apparatus are the displacement output ports. This amplifying apparatus is large in volume, and the driver needs to be placed inside the amplifying apparatus, which is not suitable for environments where the volume of the driver is limited. Besides, after the primary rhombic flexible apparatus is combined with the secondary rhombic flexible apparatus, the direction of the output displacement becomes vertical to the original direction of the displacement output by the driver.

Chinese Patent Application Publication CN108297086A discloses an asymmetrical two-stage displacement amplification flexible micro-operation apparatus comprising a base body, a piezoelectric ceramic driver, an SR displacement amplifying apparatus, a parallelogram lever amplifying apparatus and a pre-tightening bolt. The piezoelectric ceramic driver is installed on the base body through the pre-tightening bolt; the operation apparatus only controls the movement of one jaw, and the other jaw is coupled to the base body and immobilized; the output end of the piezoelectric ceramic driver is coupled to the input end of the SR displacement amplifying apparatus through a flexible hinge IV. The SR displacement amplifying apparatus is coupled to the base body through a flexible hinge I; the output end of the SR displacement amplifying apparatus is coupled to the input end of the parallelogram lever amplifying apparatus through a flexible hinge II. The output end of the parallelogram lever amplifying apparatus is coupled to the jaws through a flexible parallel double-plate apparatus; and a metal strain gauge is adhered to the flexible parallel double-plate apparatus. This amplifying apparatus is a combination of an asymmetrical amplifying unit 1 located asymmetrically on one side of the output end 3 and the parallelogram lever amplification device coupled by the SR displacement amplifying apparatus, changing the output displacement in the vertical direction to the displacement in the horizontal direction.

Chinese Patent Application Publication CN106981316A discloses a micro-displacement positioning platform with a three-stage amplifying structure comprising a fixing frame, a displacement input platform, a motion input apparatus, two sets of first-grade lever apparatuses, two sets of second-grade lever apparatuses, and a semi-axle amplifying apparatus; the two sets of first-grade lever apparatuses and the two sets of second-grade lever apparatuses are symmetrical, respectively, and the fulcrums of the first-grade lever apparatuses and the second-grade lever apparatuses are both in transmission connection with the fixing frame; the two ends of the motion input apparatus are coupled to the fixing frame and the displacement input platform, respectively; the input ends of the two sets of first-grade lever apparatuses are in transmission connection with the displacement input platform, respectively, and the output ends are in transmission connection with the input ends of the corresponding second-grade lever apparatuses, respectively; the semi-axle amplifying apparatus is connected between the output ends of the two sets of second-grade lever apparatuses. This amplifying apparatus is axisymmetrical and large in volume, and the driver needs to be placed inside the amplifying apparatus, which is not suitable for environments where the volume of the driver is limited.

With the continuous miniaturization of precision devices, the academic and engineering worlds are dedicated to finding a displacement amplifying apparatus with both a large displacement amplification ratio and a small volume. The currently known displacement amplifying apparatus only achieves a compromise between the two, or the displacement amplifying apparatus is made into an asymmetrical structure and sacrifices the precision. In fact, the constraint relationship between the displacement amplification ratio, volume miniaturization and output precision of the displacement amplifying apparatus is still a problem to be solved.

SUMMARY

The technical problem solved by the present disclosure is to provide a micro-displacement amplifying apparatus and an amplification method thereof, so that the micro-displacement amplifying device can realize a greater displacement magnification, eliminate transverse displacement, and greatly reduce the volume of the amplifying apparatus.

The micro-displacement amplifying apparatus comprises two sets of asymmetrical amplifying structures, wherein each set of the asymmetrical amplifying structure comprises a plurality of asymmetrical amplifying units connected in series by flexible hinges; the asymmetrical amplifying unit is of a non-axisymmetrical structure for amplifying a micro-displacement and comprises: an amplification output rod, an amplification fixing rod, an input end hinge and an amplification fixing end hinge; the amplification fixing rod is coupled to the lower part of the amplification output rod by the amplification fixing end hinge, which is located near the end portion of the amplification output rod, functioning to pull the end portion of the amplification output rod; the input end hinge is arranged at the lower part of the amplification output rod, and is located in the inner side of the amplification fixing end hinge, functioning to support the amplification output rod; the input end hinge and the amplification fixing end hinge are flexible hinges; the two sets of asymmetrical amplifying structures are in opposite positions and overlap with each other; the two contacting input ends are fixed and coupled to each other, and the two contacting output ends are fixed and coupled to each other; the input end is coupled to the input end hinge to input the micro-displacement; the output end is coupled to the amplification output rod to output the amplified displacement.

Further, the asymmetrical amplifying structure is an asymmetrical two-stage amplifying structure, and the asymmetrical two-stage amplifying structure comprises two asymmetrical amplifying units, which are a first-stage amplifying unit and a second-stage amplifying unit, respectively; the asymmetrical amplifying unit comprises: an amplification output rod, an amplification fixing rod, an input end hinge, an amplification fixing end hinge; the amplification output rod is transversely arranged; the amplification fixing rod is coupled to the lower part of the amplification output rod by the amplification fixing end hinge, which is located near the end portion of the amplification output rod; the input end hinge is arranged at the lower part of the amplification output rod, and is located in the inner side of the amplification fixing end hinge; the input end hinge of the first-stage amplifying unit is coupled to the input end, and the second-stage amplifying unit is coupled to the top of the amplification output rod of the first-stage amplifying unit by the input end hinge; the top of the amplification output rod of the second-stage amplifier unit is coupled to the output end by the output end hinge, and the output end is transversely arranged; the input end hinge, the amplification fixing end hinge and the output end hinge are flexible hinges; the two sets of asymmetrical two-stage amplifying apparatuses are in opposite positions and overlap with each other, and the two contacting amplification fixing rods are coupled to each other.

Further, the asymmetrical amplifying structure is an asymmetrical three-stage amplifying structure, and the asymmetrical three-stage amplifying structure comprises three asymmetrical amplifying units, which are the first-stage amplifying unit, the second-stage amplifying unit and the third-stage amplifying unit, respectively; the asymmetrical amplifying unit comprises: an amplification output rod, an amplification fixing rod, an input end hinge and an amplification fixing end hinge; the amplification output rod is transversely arranged, and the amplification fixing rod is coupled to the lower part of the amplification output rod by the amplification fixing end hinge, which is located near the end portion of the amplification output rod; the input end hinge is arranged at the lower part of the amplification output rod, and is located in the inner side of the amplification fixing end hinge; the input end hinge of the first-stage amplifying unit is coupled to the input end; the second-stage amplifying unit is coupled to the top of the amplification output rod of the first-stage amplifying unit by the input end hinge; the third-stage amplifying unit is coupled to the top of the amplification output rod of the second-stage amplifying unit by the input end hinge; the top of the third-stage amplifying unit is coupled to the output end by the output end hinge, and the output end is transversely arranged; the input end hinge, the amplification fixing end hinge and the output end hinge are flexible hinges; the two sets of asymmetrical three-stage amplifying apparatuses are in opposite positions and overlap with each other, and the two contacting amplification fixing rods are coupled to each other.

Further, the amplification fixing rod of the third-stage amplifying unit is coupled to the amplification fixing rod of the first-stage amplifying unit.

Further, the input end is configured to have an input rod, and the amplification fixing rods are located on both sides of the input end.

Further, the magnification can be adjusted by adjusting the position of the input end hinge of each asymmetrical amplifying unit on the amplification output rod.

Further, the driver comprises a non-magnetic housing, a magnetic framework, an excitation coil, an assembly and an output rod; the excitation coil, sleeved outside the first assembly, is placed in the magnetic framework, and the magnetic framework and the assembly forms a closed magnetic circuit; the magnetic framework is arranged in the non-magnetic housing, and the non-magnetic housing is used to constrain the magnetic framework; one end of the first assembly is coupled to the magnetic framework, and the other end is coupled to the input rod of the micro-displacement amplifying apparatus that is located in the non-magnetic housing; the assembly is used to transfer the displacement to the micro-displacement amplifying apparatus; the fixing end of the micro-displacement amplifying apparatus is coupled to the magnetic framework, and the output end is coupled to the rear end of the output rod; the front end of the output rod extends from the through-hole of the non-magnetic housing; the micro-displacement amplifying apparatus amplifies the displacement of the first assembly and transfers it to the output rod, and the output rod is used to output the displacement.

Further, the assembly comprises a conducting magnet, a permanent magnet and a magnetostrictive rod; the magnet comprises a plurality of conducting magnet single bodies; the permanent magnet comprises a plurality of permanent magnet single bodies; the magnetostrictive rod comprises a plurality of magnetostrictive rod single bodies; the conducting magnet single bodies are respectively coupled to both sides of the permanent magnet single bodies to form magnet units, which are coupled to both sides of the magnetostrictive rod single bodies; the conducting magnet single bodies at the rear end are coupled to the magnetic framework, and the conducting magnet single bodies at the front end are coupled to the micro-displacement amplifying apparatus; the magnet units and the magnetostrictive rods are alternately distributed at intervals in the axial direction.

Further, the driver comprises a non-magnetic housing, a magnetic framework, an excitation coil, an assembly, an output rod and a non-magnetic upper end cover; the non-magnetic housing has an opening at one end, and the non-magnetic upper end cover is arranged at the opening and has an output rod through-hole; the magnetic framework has an input rod through-hole at the top, and forms an axial permanent magnetic field; the excitation coil comprises a coil housing and a winding, which is arranged outside the coil housing, and the coil housing has an axial through-hole; the assembly comprises: a magnetostrictive rod and conducting magnets; two conducting magnets are coupled to the magnetostrictive rod at both ends, respectively; the assembly is installed in the axial through-hole; the micro-displacement amplifying apparatus is installed in the non-magnetic housing and located outside the magnetic framework; the input rod extends into the axial through-hole and is coupled to the conducting magnet; one end of the output rod is coupled to the output end, and the other end extends from the through-hole of the output rod.

Further, the driver comprises an H-shape non-magnetic housing, an upper end cover, a lower end cover, a solenoid, an assembly and an output rod; the H-shape non-magnetic housing has openings at both ends, and the inner wall is configured to have a baffle, and the baffle has an input rod through-hole; the upper end cover is coupled to the front end opening and is configured to have an output rod through-hole; the lower end cover is coupled to the rear end opening; the solenoid is installed in the H-shape non-magnetic housing and located behind the baffle with the front end pressing against the baffle and the rear end pressing against the lower end cover; the solenoid is configured to have an axial through-hole and a coil, with permanent magnets being disposed on the outer wall of the axial through-hole; the axial through-hole is in communication with the input rod through-hole, and the assembly is installed in the axial through-hole; the micro-displacement amplifying apparatus is installed in the H-shape non-magnetic housing, and located in the front of the baffle; the displacement input rod of the micro-displacement amplifying apparatus extends into the input rod through-hole and is coupled to the end portion of the assembly; one end of the output rod is coupled to the output end of the two-stage micro-displacement amplifying apparatus, and the other end extends from the through-hole of the output rod.

Further, the solenoid comprises a support end face, a solenoid body and a coil; the support end face is arranged at both ends of the solenoid body, and the coil is arranged on the outer wall of the solenoid body; the solenoid body comprises: conducting magnets and permanent magnets, which are of a ring structure; a plurality of conducting magnets and permanent magnets are alternately arranged at intervals, and connected at the contacting end faces.

Further, the axial through-hole is configured to have a heat insulation layer; the solenoid body is a tubular structure; the permanent magnets are at least two sets; and the conducting magnets are at least three sets.

Further, the asymmetrical amplifying structure is an asymmetrical two-stage amplifying structure or an asymmetrical three-stage amplifying structure.

The amplification method of the micro-displacement amplifying apparatus comprises:

The micro-displacement amplifying apparatus comprises two sets of asymmetrical amplifying structures; each set of the asymmetrical amplifying structure comprises a plurality of asymmetrical amplifying units connected in series by flexible hinges; the two asymmetrical amplifying structures are in opposite positions and overlap each other, and the input end and output end are coupled to the asymmetrical amplifying units by flexible hinges, respectively; the two contacting input ends are coupled to each other, and the two contacting output ends are coupled to each other; the input end is coupled to the displacement output end of the magnetostrictive driver, and the amplification fixing rods are located at both sides of the input end and coupled inside the magnetostrictive driver;

The micro-displacement input by the magnetostrictive driver is transferred to the input end, and the input end transfers the micro-displacement to the flexible hinge on one side of the input end of the first-stage asymmetrical amplifying unit; the amplification fixing rod of the asymmetrical amplifying unit at each stage is fixed and immobilized, and the amplification fixing rod pulls the end portion of the amplification output rod by the flexible hinge coupled to the amplification output rod; the flexible hinge which is coupled to the input end and the amplification output rod pushes up the amplification output rod, so that the end portion of the amplification output rod moves upward, making the amplification output rods of the overlapping asymmetrical amplifying units deflected simultaneously to complete the displacement amplification;

The amplified micro-displacement is transferred to the next-stage asymmetrical amplifying unit, or the amplified micro-displacement is output through the output end.

Preferably, the asymmetrical amplifying structure is selected from an asymmetrical two-stage amplifying structure. The asymmetrical two-stage amplifying structure comprises two asymmetrical amplifying units, which are a first-stage amplifying unit and a second-stage amplifying unit; the amplification fixing rod of the first-stage amplifying unit is fixed and immobilized, and pulls the end portion of the amplification output rod of the first-stage amplifying unit by the amplification fixing end hinge of the first-stage amplifying unit; the amplification fixing rod of the second-stage amplifying unit is fixed and immobilized, and pulls the end portion of the amplification output rod of the second-stage amplifying unit by the amplification fixing end hinge of the second-stage amplifying unit; the input end pushes up the amplification output rod of the first-stage amplifying unit by the input end hinge of the first-stage amplifying unit; the amplification output rod of the first-stage amplifying unit pushes up the amplification output rod of the second-stage amplifying unit by the input end hinge of the second-stage amplifying unit; the amplification fixing end hinge and the input end hinge are flexible hinges.

Preferably, the asymmetrical amplifying structure is selected from an asymmetrical three-stage amplifying structure, and the asymmetrical three-stage amplifying structure comprises three asymmetrical amplifying units, which are a first-stage amplifying unit, a second-stage amplifying unit and a third-stage amplifying unit, respectively; the amplification fixing rod of the first-stage amplifying unit is fixed and immobilized, and pulls the end portion of the amplification output rod of the first-stage amplifying unit by the amplification fixed end hinge of the first-stage amplifying unit; the amplification fixing rod of the second-stage amplifying unit is fixed and immobilized, and pulls the end portion of the amplification output rod of the second-stage amplifying unit by the amplification fixing end hinge of the second-stage amplifying unit; the amplification fixing rod of the third-stage amplifying unit is fixed and immobilized, and pulls the end portion of the amplification output rod of the third-stage amplifying unit by the amplification fixing end hinge of the third-stage amplifying unit; the input end pushes up the amplification output rod of the first-stage amplifying unit by the input end hinge of the first-stage amplifying unit; the amplification output rod of the first-stage amplifying unit pushes up the amplification output rod of the second-stage amplifying unit by the input end hinge of the second-stage amplifying unit; the amplification output rod of the second-stage amplifying unit pushes up the amplification output rod of the third-stage amplifying unit by the input end hinge of the third-stage amplifying unit; the amplification fixing end hinge and the input end hinge are flexible hinges.

Compared with the existing technology, the technical effects of the present disclosure include:

1. The two asymmetrical amplifying structures are arranged in opposite positions and in an overlapping manner, which allows the micro-displacement amplifying apparatus to achieve a greater displacement magnification and eliminate the transverse displacement, greatly reducing the volume of the amplifying apparatus.

(1) The existing symmetrical micro-displacement amplifying device generally takes the center of the device as the axis of symmetry, and the two sides are symmetrical structures. In the displacement amplifying process, the device amplifies the displacement in a lever manner, so the output end of the device inevitably produces a certain angle with the horizontal plane, thereby generating a transverse displacement. Therefore, one half of the existing symmetrical micro-displacement amplifying device is effective for the amplification effect, and the other half of the device is used to eliminate the transverse displacement by pulling.

(2) Due to the use of two sets of asymmetrical amplifying structures which are arranged in opposite positions and in an overlapping manner in the present disclosure, the output ends of the two sets of asymmetrical amplifying structures can eliminate the transverse displacement by extrusion; without adopting an axisymmetrical structure, the present disclosure greatly reduces the volume of the amplifying apparatus while achieving the same amplification effect of the existing symmetrical micro-displacement amplifying devices.

(3) Due to the use of two sets of asymmetrical amplifying structures which are arranged in opposite positions and in an overlapping manner in the present disclosure, the present disclosure can achieve a greater displacement magnification while having the same volume as the existing symmetrical micro-displacement amplifying devices.

(4) Due to the use of two sets of asymmetrical amplifying structures which are arranged in opposite positions and in an overlapping manner in the present disclosure, the present disclosure greatly reduces the volume of the amplifying apparatus while achieving the same amplification effect of the existing symmetrical micro-displacement amplifying devices; therefore, the amplifying apparatus can be placed inside the magnetostrictive driver, achieving the miniaturization of the driver.

2. After the output ends of the two asymmetrical amplifying units are fixed and coupled to each other, under the action of force, the transverse displacement caused by the tilt of the output end is eliminated, and the output displacement is only an upward displacement in the axial direction, which effectively improves the axial output precision.

3. Since the amplifying apparatus is placed inside the magnetostrictive driver, it does not take up extra space, which therefore expands the driver's application environment while maintaining a large output displacement of the driver.

4. Due to the use of multiple sets of magnetostrictive rods and the method of forming an assembly by adding a combination of permanent magnets and conducting magnets between each set of magnetostrictive rods, the uniformity of the bias magnetic field is effectively improved, and the working state of the rare earth supermagnetostrictive driver is more stable.

5. Due to the use of permanent magnets in combination with conducting magnets instead of the existing solenoid framework, the driver does not need to design the bias magnetic field, which effectively saves the space of the device and achieves the miniaturization of the device.

DETAILED DESCRIPTION OF THE EMBODIMENTS

The technical solutions of the present disclosure are described in detail hereinbelow with reference to the exemplified embodiments. However, the exemplified embodiments can be carried out in various forms, and should not be understood as being limited to the embodiments as described herein; on the contrary, the provision of these embodiments makes the present disclosure more comprehensive and complete, and fully conveys the concept of the exemplified embodiments to a person skilled in the art.

Figure 1:
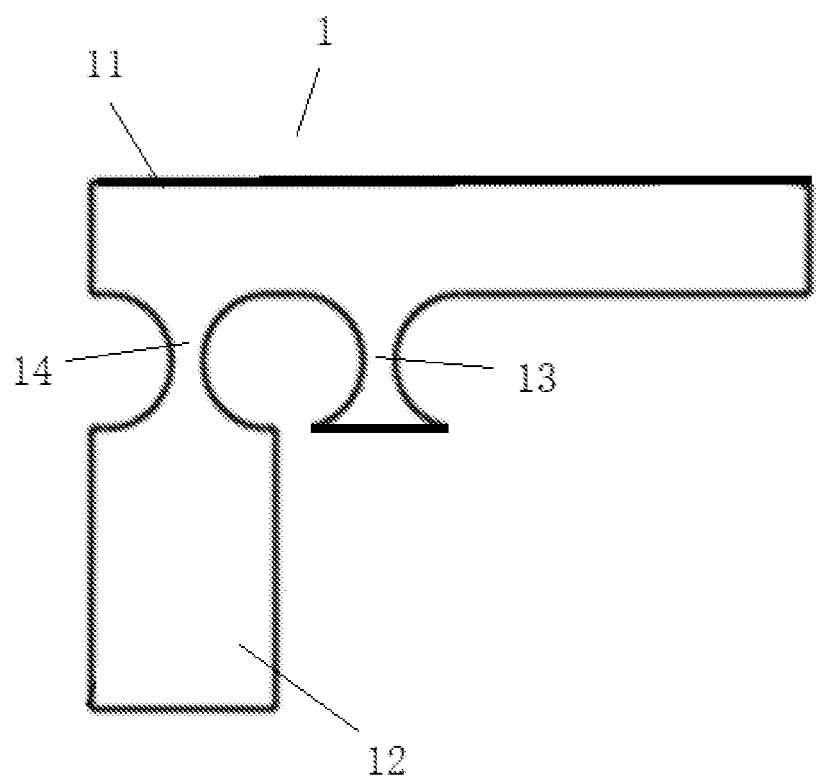
FIG. 1 is a view of the structure of an asymmetrical amplifying unit in the present disclosure.

As shown in FIG. 1, it is a view of the structure of the asymmetrical amplifying unit 1 in the present disclosure.

The asymmetrical amplifying unit 1 includes: an amplification output rod 11, an amplification fixing rod 12, an input end hinge 13 and an amplification fixing end hinge 14; the amplification output rod 11 is transversely arranged, and the amplification fixing rod 12 is coupled to the lower part of the amplification output rod by the amplification fixing end hinge 14, which is located near the end portion of the amplification output rod 11; the input end hinge 13 is arranged at the lower part of the amplification output rod 11, and is located in the inner side of the amplification fixing end hinge 14. The input end hinge 13 and the amplification fixing end hinge 14 are flexible hinges.

By using the principle of the lever, the amplification fixing end hinge 14 pulls the end portion of the amplification output rod 11; the input end hinge 13 acts as a support; the magnification can be changed by adjusting the position of the input end hinge 13 on the amplification output rod 11.

The asymmetrically amplifying unit 1 adopts a non-axisymmetrical structure, which effectively avoids the space occupied by the part that is ineffective for the amplification effect in the traditional axisymmetrical structure, and reduces the volume of the amplifying apparatus.

Figure 2:
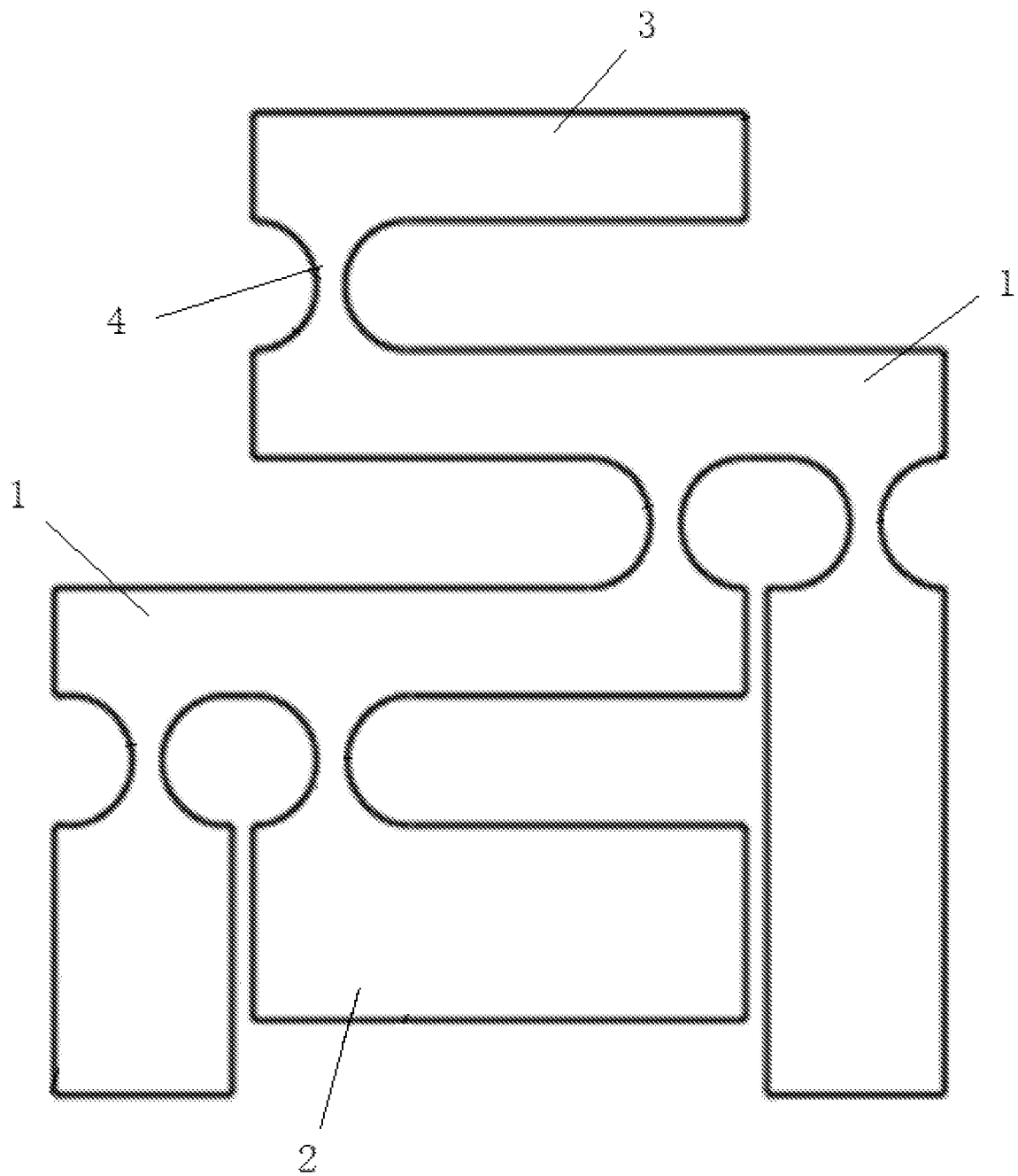
FIG. 2 is a view of the structure of two asymmetrical amplifying units connected in series in the present disclosure.

As shown in FIG. 2, it is a view of the structure of two asymmetrical amplifying units 1 connected in series in the present disclosure.

In the two asymmetrical amplifying units 1 connected in series, the asymmetrical amplifying unit 1 on the side of the output end 3 is coupled to the asymmetrical amplifying unit 1 on the side of the input end 2 at the top of its amplification output rod 11 by an input hinge 13; the input hinge 13 of the asymmetrical amplifying unit 1 on the side of the input end 2 is coupled to the input end 2; the amplification fixing rods 12 of the two asymmetrical amplifying units 1 are respectively located at the two sides of the input end 2; the asymmetrical amplifying unit 1 on the side of the output end 3 is coupled to the output end 3 at the top by the output end hinge 4; the output terminal 3 is transversely arranged. The output end hinge 4 is a flexible hinge.

The magnification can be adjusted by adjusting the position of the input end hinge 13 of the asymmetrical amplifying unit 1 on the side of the input end 2 on the amplification output rod 11, and further, the magnification can be changed by adjusting the coupling position between the input end hinge 13 of the asymmetric amplifying unit 1 on the side of the output end 3 and the amplification output rod 11 of the asymmetric amplifying unit 1 on the side of the output end 3.

Figure 3:
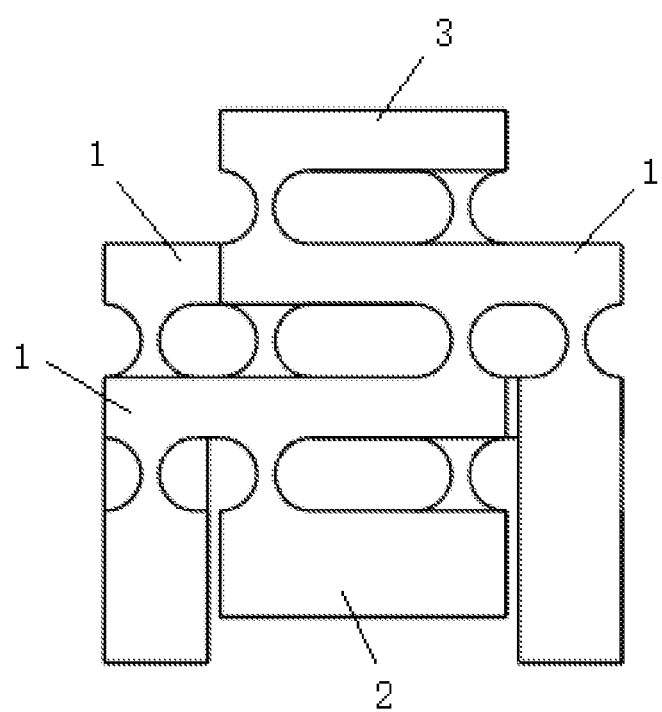
FIG. 3 is the front view of the structure of a two-stage micro-displacement amplifying apparatus in the present disclosure.
Figure 4:
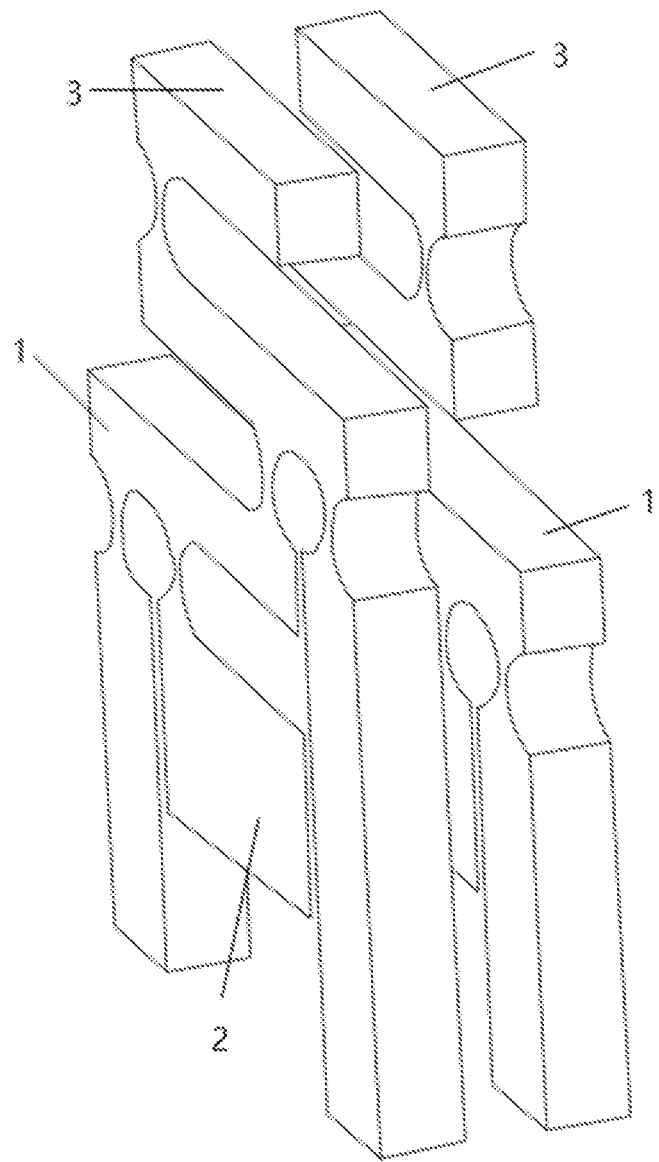
FIG. 4 is the three-dimensional view of the structure of a two-stage micro-displacement amplifying apparatus in the present disclosure.

As shown in FIG. 3, it is the front view of the structure of a two-stage micro-displacement amplifying apparatus in the present disclosure; as shown in FIG. 4, it is the three-dimensional view of the structure of a two-stage micro-displacement amplifying apparatus in the present disclosure.

The two-stage micro-displacement amplifying apparatus includes: two sets of asymmetrical amplifying structures connected in series; each set of asymmetrical amplifying structures connected in series includes two asymmetrical amplifying units 1 connected in series; the two sets of asymmetrical amplifying structures connected in series are in opposite positions and overlap each other. After the two sets of asymmetrical amplifying structures connected in series overlap each other, two contacting input ends 2 are coupled to each other; on both sides of the input end 2, two contacting amplification fixing rods 12 are coupled to each other. The two contacted output ends 3 are coupled to each other. Other non-coupled parts of the two-stage micro-displacement amplifying apparatus can move freely.

The two sets of asymmetrical amplifying structures connected in series are in opposite positions, that is, one set of asymmetrical amplifying structures connected in series, after being turned 180° horizontally, falls at the position of the other set of asymmetrical amplifying structures connected in series.

The amplification method of the two-stage micro-displacement amplifying apparatus comprises the following specific steps:

The input end hinge 13 of the asymmetrical amplifying unit 1 on the side of the input end 2 is coupled to the input end 2, and the input end 2 is coupled to the displacement output end of the magnetostrictive driver; two amplification fixing rods 12 are respectively located on the two sides of the input end 2 and coupled inside the magnetostrictive driver;

The micro-displacement input by the magnetostrictive driver is transferred to the input end 2, which transfers the displacement to the input end hinge 13 of the asymmetric amplifying unit 1 on the side of the input end 2, and the input end hinge 13 transfers the displacement to the amplification output rod 11 of the asymmetrical amplifying unit 1 on the side of the input end 2; two amplification output rods 11 of the asymmetrical amplifying unit 1 on the side of the input end 2 deflect simultaneously, and the end portions move upward;

The amplification output rods 11 of the asymmetrical amplifying unit 1 on the side of the input end 2 transfer the amplified displacement to two input end hinges 13 of the asymmetric amplifying unit 1 on the side of the output end 3, which transfers the displacement to the amplification output rod 11 of the asymmetrical amplifying unit 1 on the side of the output end 3; the amplification output rods 11 of the asymmetrical amplifying unit 1 on the side of the output end 3 deflects, and the end portions move upward;

Two amplification output rods 11 of the asymmetrical amplifying unit 1 on the side of the output end 3 transfers the displacement to the output end hinge 4, which drives the output end 3 of the asymmetrical amplifying unit 1 on the side of the output end 3 to move upward and realize the amplified output of the micro-displacement of the magnetostrictive driver.

The amplification fixing rod 12 of the asymmetrical amplifying unit 1 on the side of the input end 2 is fixed and immobilized, which functions to pull the end portion of the amplification output rod 11 of the asymmetrical amplifying unit 1 on the side of the input end 2 by the amplification fixing end hinge 14; the input end 2 pushes up and deflect the amplification output rod 11 of the asymmetrical amplifying unit 1 on the side of the input end 2 by the input end hinge; the amplification fixing rod 12 of the asymmetrical amplifying unit 1 on the side of the output end 3 is fixed and immobilized, which functions to pull the end portion of the amplification output rod 11 of the asymmetrical amplifying unit 1 on the side of the output end 3 by the amplification fixing end hinge 14; the amplification output rod 11 of the asymmetrical amplifying unit 1 on the side of the input end 2 pushes up and deflect the amplification output rod 11 of the asymmetrical amplifying unit 1 on the side of the output end 3 by the input end hinge 13 of the asymmetric amplifying unit 1 on the side of the output end 3, and the end portion moves upward.

The magnification can be adjusted by adjusting the position of the input end hinge 13 of the asymmetrical amplifying unit 1 on the side of the input end 2 on the amplification output rod 11, and further, the magnification can be changed by adjusting the position of the input end hinge 13 of the asymmetric amplifying unit 1 on the side of the output end 3 on the amplification output rod 11.

Example 1 which is preferred in the present disclosure includes: a first asymmetrical two-stage amplifying structure 100 and a second asymmetrical two-stage amplifying structure 200.

Figure 5:
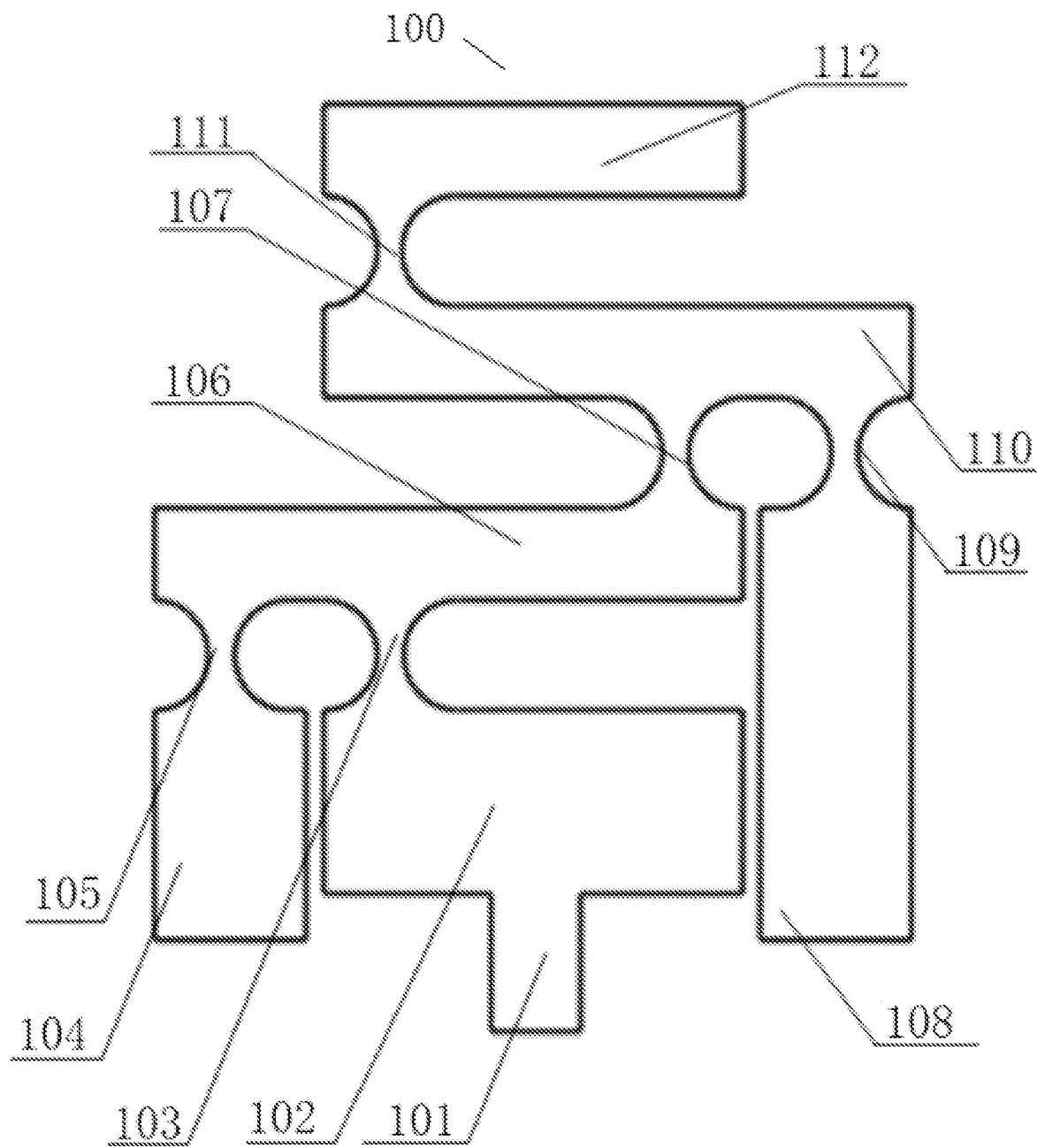
FIG. 5 is a view of the structure of a first asymmetrical two-stage amplifying structure in the present disclosure.

As shown in FIG. 5, it is a view of the structure of the first asymmetrical two-stage amplifying structure 100 in the present disclosure.

The first asymmetrical two-stage amplifying structure 100 adopts a two-stage amplification, and the structure thereof includes: a first input rod 101, a first input end 102, a first-stage input end hinge 103, a first first-stage amplification fixing rod 104, and a first first-stage amplification fixing end hinge 105 and a first first-stage amplification output rod 106; a first second-stage input end hinge 107, a first second-stage amplification fixing rod 108, a first second-stage amplification fixing end hinge 109, a first second-stage amplification output rod 110, a first second-stage output end hinge 111 and a first output end 112.

The first first-stage input end hinge 103, the first first-stage amplification fixing end hinge 105, the first second-stage input end hinge 107, the first second-stage amplification fixing end hinge 109 and the first second-stage output end hinge 111 are flexible hinges.

The top of the first input end 102 is coupled to the bottom of the first first-stage amplification output rod 106 by the first first-stage input end hinge 103, and the top of the first first-stage amplification fixing rod 104 is coupled to the bottom of the first first-stage amplification output rod 106 by the first first-stage amplification fixing end hinge 105; the first first-stage amplification output rod 106 is transversely arranged, and the first first-stage amplification fixing rod 104 is on the left side of the first input end 102; the first first-stage input end hinge 103 and the first first-stage amplification fixing end hinge 105 are on the left side of the first first-stage amplification output rod 106; the top of the first second-stage amplification fixing rod 108 is coupled to the bottom of the first second-stage amplification output rod 110 by the first second-stage amplification fixing end hinge 109, and the top of the first first-stage amplification output rod 106 is coupled to the bottom of the first second-stage amplification output rod 110 by the first second-stage input end hinge 107; the first second-stage amplification output rod 110 is transversely arranged; the first second-stage amplification fixing end hinge 109 is on the right side of the first second-stage input end hinge 107, and the first second-stage input end hinge 107 is on the right side of the first first-stage amplification output rod 106; the bottom of the first output end 112 is coupled to the top of the first second-stage amplification output rod 110 by the first second-stage output end hinge 111, which is on the left side of the first second-stage amplification output rod 110; the first output end 112 is transversely arranged.

Figure 6:
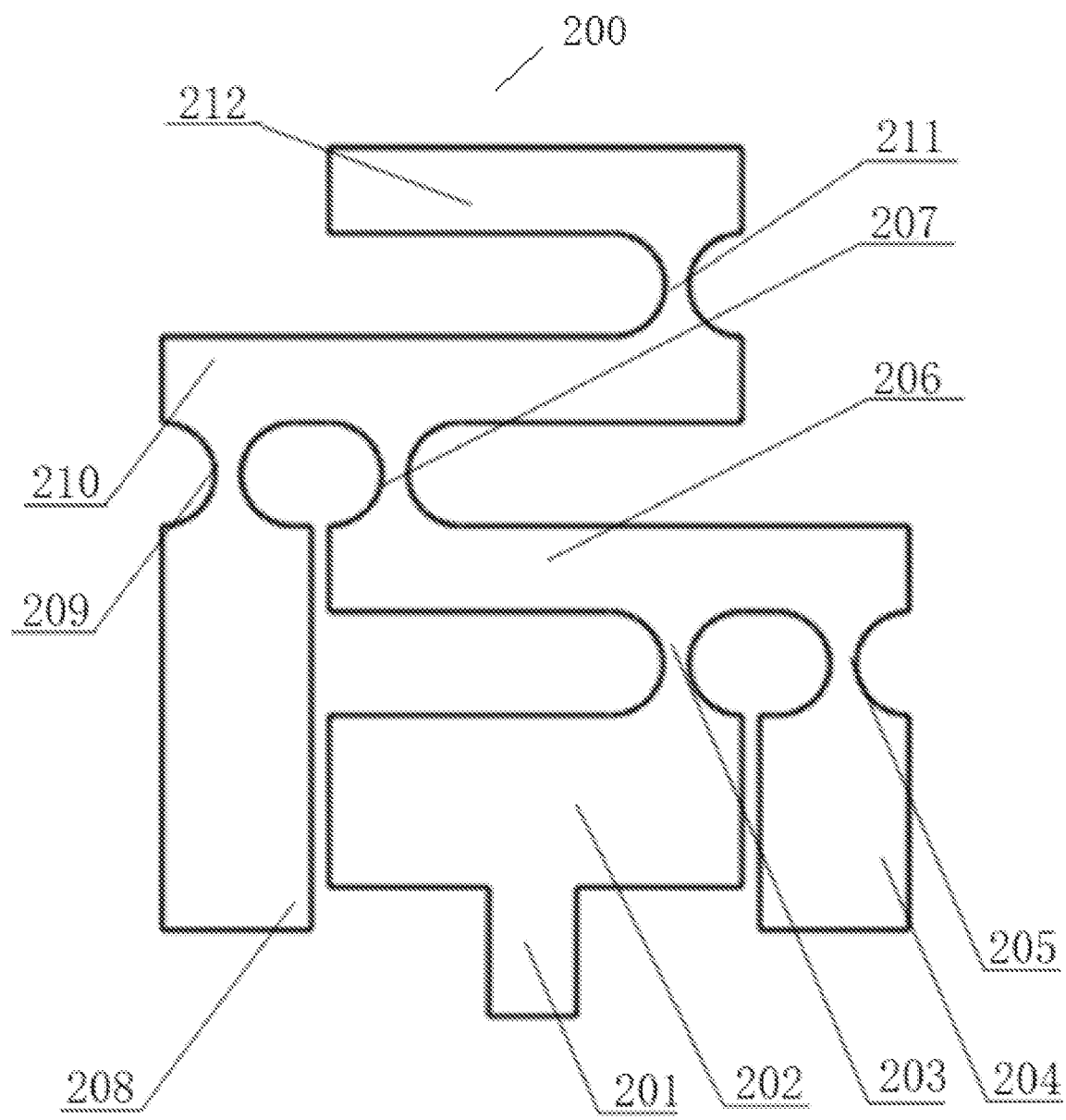
FIG. 6 is a view of the structure of a second asymmetrical two-stage amplifying structure in the present disclosure.

As shown in FIG. 6, it is a view of the structure of the second asymmetrical two-stage amplifying structure 200 in the present disclosure.

The second asymmetrical two-stage amplifying structure 200 adopts a two-stage amplification, and the structure thereof includes: a second input rod 201, a second input end 202, a second first-stage input end hinge 203, a second first-stage amplification fixing rod 204, and a second first-stage amplification fixing end hinge 205 and a second first-stage amplification output rod 206; a second first-stage output end hinge 207, a second second-stage amplification fixing rod 208, a second second-stage amplification fixing end hinge 209, a second second-stage amplification output rod 210, a second second-stage output end hinge 211 and a second output end 212.

The second first-stage input end hinge 203, the second first-stage amplification fixing end hinge 205, the second first-stage output end hinge 207, the second second-stage amplification fixing end hinge 209 and the second second-stage output end hinge 211 are flexible hinges.

In order to facilitate the coupling to the displacement output end of the magnetostrictive driver, the second asymmetrical two-stage amplifying structure 200 is configured to have the second input rod 201 at the lower part of the second input end 202, and the first asymmetrical two-stage amplifying structure 100 is configured to have the first input rod 101 at the lower part of the first input end 102.

The top of the second input end 202 is coupled to the bottom of the second first-stage amplification output rod 206 by the second first-stage input end hinge 203, and the top of the second first-stage amplification fixing rod 204 is coupled to the bottom of the second first-stage amplification output rod 206 by the second first-stage amplification fixing end hinge 205; the second first-stage amplification output rod 206 is transversely arranged, and the second first-stage amplification fixing rod 204 is on the right side of the second input end 202; the second first-stage input end hinge 203 and the second first-stage amplification fixing end hinge 205 are on the right side of the second first-stage amplification output rod 206; the top of the second second-stage amplification fixing rod 208 is coupled to the bottom of the second second-stage amplification output rod 210 by the second second-stage amplification fixing end hinge 209, and the top of the second first-stage amplification output rod 206 is coupled to the bottom of the second second-stage amplification output rod 210 by the second first-stage output end hinge 207; the second second-stage amplification output rod 210 is transversely arranged; the second second-stage amplification fixing end hinge 209 is on the left side of the second first-stage output end hinge 207, and the second first-stage output end hinge 207 is on the left side of the second first-stage amplification output rod 206; the bottom of the second output end 212 is coupled to the top of the second second-stage amplification output rod 210 by the second second-stage output end hinge 211, which is on the right side of the second second-stage amplification output rod 210; the second output end 212 is transversely arranged.

In the first asymmetrical two-stage amplifying structure 100 and the second asymmetrical two-stage amplifying structure 200, the first input rod 101 is fixed and coupled to the second input rod 201; the first input end 102 is fixed and coupled to the second input end 202; the first output end 112 is fixed and coupled to the second output end 212; the first first-stage amplification fixing rod 104 of the first asymmetrical two-stage amplifying structure 100 is fixed and coupled to the second second-stage amplification fixing rod 208 of the second asymmetrical two-stage amplifying structure 200; the first second-stage amplification fixing rod 108 of the first asymmetrical two-stage amplifying structure 100 is fixed and coupled to the second first-stage amplification fixing rod 204 of the second asymmetrical two-stage amplifying structure 200.

The amplification method of the two-stage micro-displacement amplifying apparatus comprises the following steps:

Step 1: The first input rod 101 and the second input rod 201 are coupled to the displacement output end of the magnetostrictive driver; the first first-stage amplification fixing rod 104, the second second-stage amplification fixing rod 208, the first second-stage amplification fixing rod 108 and the second first-stage amplification fixing rod 204 are coupled inside the magnetostrictive driver; the first input rod 101 transfers the micro-displacement input by the magnetostrictive driver to the first input end 102, and meanwhile, the second input rod 201 transfers the micro-displacement input by the magnetostrictive driver to the second input end 202.

Step 2: The first input end 102 transfers the displacement to the first first-stage input end hinge 103, which transfers the displacement to the first first-stage amplification output rod 106; meanwhile, the second input end 202 transfers the displacement to the second first-stage input end hinge 203, which transfers the displacement to the second first-stage amplification output rod 206; the first first-stage amplification output rod 106 deflects, and the right end moves upward; the second first-stage amplification output rod 206 deflects, and the left end moves upward.

The positions of the first first-stage amplification fixing rod 104 and the second first-stage amplification fixing rod 204 are fixed; the first first-stage amplification fixing rod 104 and the second first-stage amplification fixing rod 204 are fixed and immobilized; by using the principle of the lever, the first first-stage amplification fixing rod 104 functions to pull the end portion of the first first-stage amplification output rod 106 by the first first-stage amplification fixing end hinge 105; the first input end 102 pushes up and deflects the first first-stage amplification output rod 106 by the first first-stage input end hinge 103; the right end moves upward; the second first-stage amplification fixing rod 204 functions to pull the right end portion of the second first-stage amplification output rod 206 by the second first-stage amplification fixing end hinge 205; the second input end 202 pushes up the left end of the second first-stage amplification output rod 206 by the second first-stage input end hinge 203; the second first-stage amplification output rod 206 deflects; the left end moves upward.

The left arc opening of the first first-stage amplification fixing end hinge 105 and the first first-stage input end hinge 103 becomes smaller, while the right arc opening becomes larger; the left arc opening of the second first-stage amplification fixing end hinge 205 and the second first-stage input end hinge 203 becomes larger, while the right arc opening becomes smaller.

Step 3: The first first-stage amplification output rod 106 transfers the displacement to the first second-stage input end hinge 107, which transfers the displacement to the first second-stage amplification output rod 110; the first second-stage amplification output rod 110 deflects, and the left end moves upward; the second first-stage amplification output rod 206 transfers the displacement to the second first-stage output end hinge 207, which transfers the displacement to the second second-stage amplification output rod 210; the second second-stage amplification output rod 210 deflects, and the right end moves upward.

The first second-stage amplification fixing rod 108 is fixed and immobilized, which functions to pull the end portion of the first second-stage amplification output rod 110 by the first second-stage amplification fixing end hinge 109; the first first-stage amplification output rod 106 pushes up the first second-stage amplification output rod 110 by the first second-stage input end hinge 107; the first second-stage amplification output rod 110 deflects, and the left end moves upward; the second second-stage amplification fixing rod 208 is fixed and immobilized, which functions to pull the end portion of the second second-stage amplification output rod 210 by the second second-stage amplification fixing end hinge 209; the second first-stage amplification output rod 206 pushes up the second second-stage amplification output rod 210 by the second first-stage output end hinge 207; the second second-stage amplification output rod 210 deflects, and the right end moves upward.

The left arc opening of the first second-stage input end hinge 107 and the first second-stage amplification fixing end hinge 109 becomes larger, while the right arc opening becomes smaller, so that the left end of the first second-stage amplification output rod 110 moves upward; the left arc opening of the second first-stage output end hinge 207 and the second second-stage amplification fixing end hinge 209 becomes smaller, while the right arc opening becomes larger, so that the right end of the second second-stage amplification output rod 210 moves upward.

Step 4: The first second-stage amplification output rod 110 transfers the displacement to the first second-stage output end hinge 111, which drives the first second-stage output end hinge 111 to move upward (not straight up and down); the first second-stage output end hinge 111 drives the first output end 112 to move upward; the second second-stage amplification output rod 210 transfers the displacement to the second second-stage output end hinge 211, which drives the second second-stage output end hinge 211 to move upward; the second second-stage output end hinge 211 drives the second output end 212 to move upward.

The left arc opening of the first second-stage output end hinge 111 becomes smaller, while the right arc opening becomes larger; the left arc opening of the second second-stage output end hinge 211 becomes larger, while the right arc opening becomes smaller.

The first first-stage amplification fixing rod 104, the second second-stage amplification fixing rod 208, the first second-stage amplification fixing rod 108 and the second first-stage amplification fixing rod 204 are fixed and coupled, and the first output end 112 and the second output end 212 are fixed and coupled; under the action of force, the coupled first output end 112 and second output end 212 output an axially upward displacement, which eliminates the transverse displacement of the first first-stage amplification output rod 106, the second first-stage amplification output rod 206, the first output end 112 and the second output end 212, avoids the generation of a shear force, and effectively improves the axial output precision.

Figure 7:
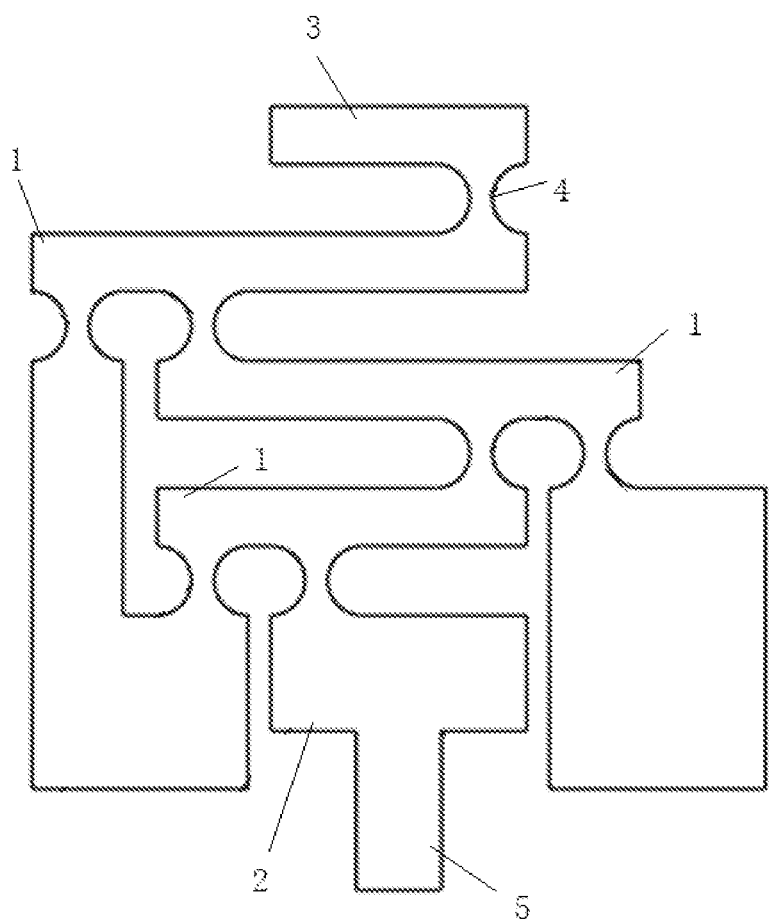
FIG. 7 is a view of the structure of an asymmetrical three-stage amplifying structure in the present disclosure.

As shown in FIG. 7, it is a view of the structure of an asymmetrical three-stage amplifying structure in the present disclosure.

The asymmetrical three-stage amplifying structure includes: three asymmetrical amplifying units 1 connected in series, which are the first-stage amplifying unit, the second-stage amplifying unit and the third-stage amplifying unit, respectively; the input end hinge 13 of the first-stage amplifying unit is coupled to the input end 2, and the input end 2 is coupled to an input rod 5; the second-stage amplifying unit is coupled to the top of the amplification output rod 11 of the first-stage amplifying unit by the input end hinge 13; the amplification fixing rod 12 of the third-stage amplifying unit is coupled to the amplification fixing rod 12 of the first-stage amplifying unit; the amplification fixing rods 12 of the three asymmetrical amplifying units 1 are located on both sides of the input end 2; the top of the three-stage amplifying structure is coupled to the output end 3 by the output end hinge 4, and the output end 3 is transversely arranged. The output end hinge 4 is a flexible hinge.

The magnification can be adjusted by adjusting the position of the input end hinge 13 on the amplification output rod 11.

Figure 8:
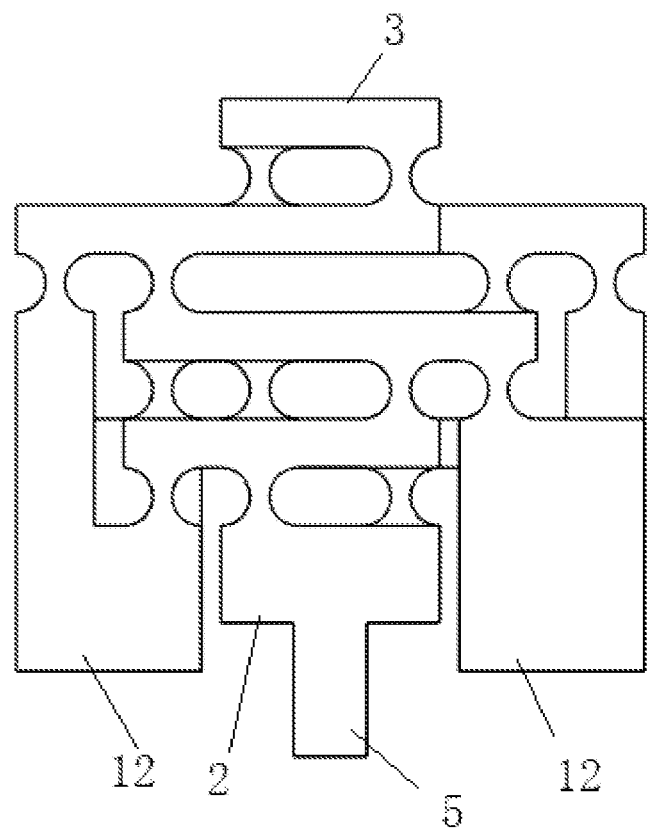
FIG. 8 is the front view of the structure of a three-stage micro-displacement amplifying apparatus in the present disclosure.
Figure 9:
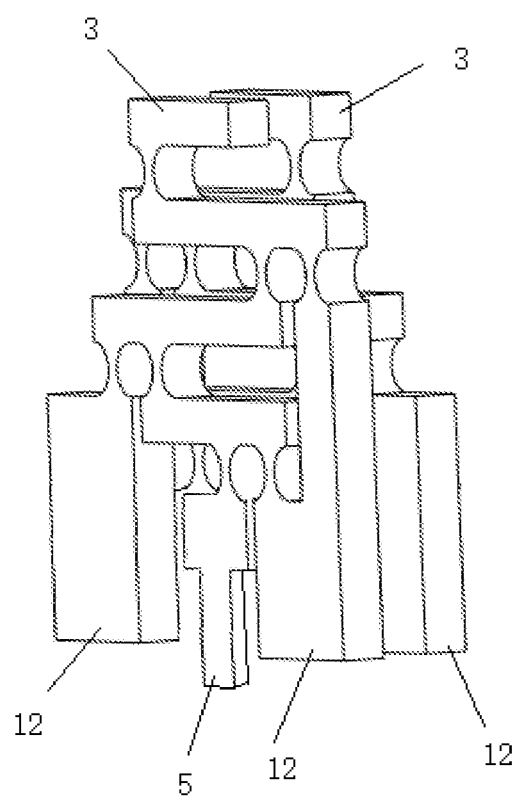
FIG. 9 is the three-dimensional view of the structure of a three-stage micro-displacement amplifying apparatus in the present disclosure.

As shown in FIG. 8, it is the front view of the structure of a three-stage micro-displacement amplifying apparatus in the present disclosure; as shown in FIG. 9, it is the three-dimensional view of the structure of a three-stage micro-displacement amplifying apparatus in the present disclosure.

The three-stage micro-displacement amplifying apparatus includes: two asymmetrical three-stage amplifying structures, which are in opposite positions and overlap each other; after the two asymmetrical three-stage amplifying structures overlap each other, two contacting input ends 2 are coupled to each other; two contacting input rods 5 are coupled to each other; two contacting amplification fixing rods 12 are coupled to each other; two contacting output ends 3 are coupled to each other. Other non-coupled parts of the two-stage micro-displacement amplifying apparatus can move freely. The input rod 5 can facilitate the introduction of a micro-displacement.

The two asymmetrical three-stage amplifying structures are in opposite positions, that is, one of the asymmetrical three-stage amplifying structures, after being turned 180° horizontally, becomes the other asymmetrical three-stage amplifying structure.

The amplification method of the three-stage micro-displacement amplifying apparatus comprises the following specific steps:

The input rod 5 of the first-grade amplifying unit is coupled to the input end of the magnetostrictive driver, and the amplification fixing rod 12 is fixed and coupled inside the magnetostrictive driver;

The micro-displacement input by the magnetostrictive driver is transferred to the input end 2 by the input rod 5; the input end 2 transfers the displacement to the input end hinge 13 of the first-grade amplifying unit, and the input end hinge 13 of the first-grade amplifying unit transfers the displacement to the amplification output rod 11 of the first-grade amplifying unit; two amplification output rods 11 of the first-grade amplifying unit deflect simultaneously, and the end portions move upward;

The amplification output rods 11 of the first-grade amplifying unit transfer the amplified displacement to two input end hinges 13 of the second-grade amplifying unit; the input end hinges 13 of the second-grade amplifying unit transfer the displacement to the amplification output rods 11 of the second-grade amplifying unit; the amplification output rods 11 of the second-grade amplifying unit deflect, and the end portions move upward;

The amplification output rods 11 of the second-grade amplifying unit transfer the amplified displacement to two input end hinges 13 of the third-grade amplifying unit; the input end hinges 13 of the third-grade amplifying unit transfer the displacement to the amplification output rods 11 of the third-grade amplifying unit; the amplification output rods 11 of the third-grade amplifying unit deflect, and the end portions move upward;

Two amplification output rods 11 of the third-grade amplifying unit transfers the amplified displacement to the output end hinge 4, which drives the output end 3 to move upward and realize the amplified output of the micro-displacement of the magnetostrictive driver.

The amplification fixing rod 12 of the first-grade amplifying unit is fixed and immobilized, which functions to pull the end portion of the amplification output rod 11 of the first-grade amplifying unit by the amplification fixing end hinge 14 of the first-grade amplifying unit; the input end 2 pushes up and deflect the amplification output rod 11 of the first-grade amplifying unit by the input end hinge 13 of the first-grade amplifying unit; the amplification fixing rod 12 of the second-grade amplifying unit is fixed and immobilized, which functions to pull the end portion of the amplification output rod 11 of the second-grade amplifying unit by the amplification fixing end hinge 14 of the second-grade amplifying unit; the amplification output rod 11 of the first-grade amplifying unit pushes up and deflect the amplification output rod 11 of the second-grade amplifying unit by the output end hinge 13 of the second-grade amplifying unit, and the end portion moves upward; the amplification fixing rod 12 of the third-grade amplifying unit functions to pull the end portion of the amplification output rod 11 of the third-grade amplifying unit by the amplification fixing end hinge 14 of the third-grade amplifying unit; the amplification output rod 11 of the second-grade amplifying unit pushes up and deflect the amplification output rod 11 of the third-grade amplifying unit by the output end hinge 13 of the third-grade amplifying unit, and the end portion moves upward.

The magnification can be changed by adjusting the position of the input end hinge 13 of the first-grade amplifying unit, the input end hinge 13 of the second-grade amplifying unit and the input end hinge 13 of the third-grade amplifying unit on the amplification output rods 11.

Figure 10:
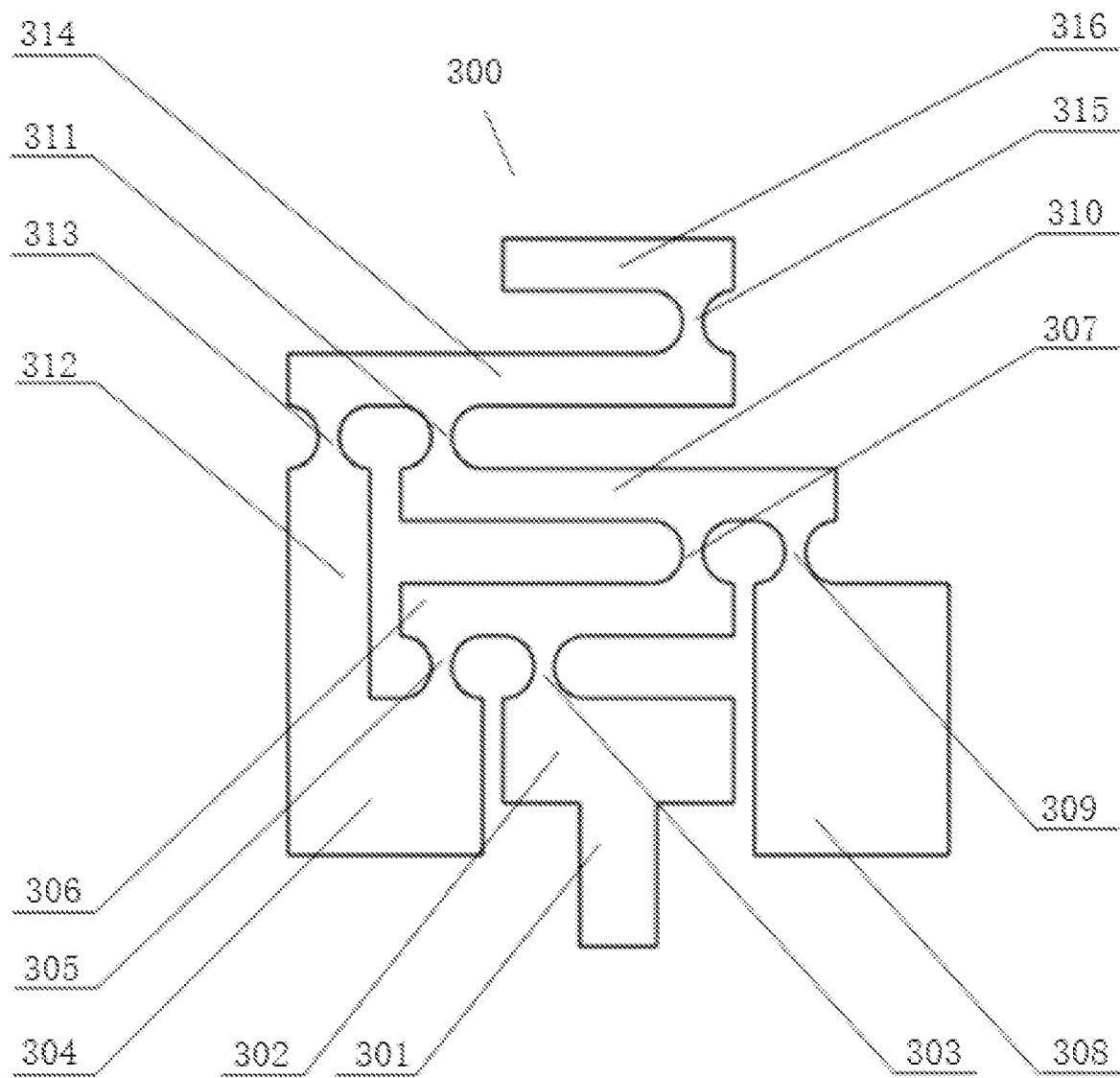
FIG. 10 is a view of the structure of a first asymmetrical three-stage amplifying structure in the present disclosure.

As shown in FIG. 10, it is a view of the structure of a first asymmetrical three-stage amplifying structure 300 in the present disclosure.

Example 2 which is preferred in the present disclosure includes: a first asymmetrical three-stage amplifying structure 300 and a second asymmetrical three-stage amplifying structure 400.

The first asymmetrical three-stage amplifying structure 300 adopts a three-stage amplification, and the structure thereof includes: a first input rod 301, a first input end 302, a first first-stage input end hinge 303, a first first-stage amplification fixing rod 304, and a first first-stage amplification fixing end hinge 305 and a first first-stage amplification output rod 306; a first second-stage input end hinge 307, a first second-stage amplification fixing rod 308, a first second-stage amplification fixing end hinge 309, a first second-stage amplification output rod 310, a first third-stage input end hinge 311, a first third-stage amplification fixing rod 312, a first third-stage amplification fixing end hinge 313, a first third-stage amplification output rod 314, a first output end hinge 315 and a first output end 316.

The first first-stage input end hinge 303, the first first-stage amplification fixing end hinge 305, the first second-stage input end hinge 307, the first second-stage amplification fixing end hinge 309, the first third-stage input end hinge 311, the first third-stage amplification fixing end hinge 313 and the first output end hinge 315 are flexible hinges.

The top of the first input end 302 is coupled to the bottom of the first first-stage amplification output rod 306 by the first first-stage input end hinge 303, and the top of the first first-stage amplification fixing rod 304 is coupled to the bottom of the first first-stage amplification output rod 306 by the first first-stage amplification fixing end hinge 305; the first first-stage amplification output rod 306 is transversely arranged, and the first first-stage amplification fixing rod 304 is on the left side of the first input end 302; the first first-stage input end hinge 303 and the first first-stage amplification fixing end hinge 305 are on the left side of the first first-stage amplification output rod 306; the top of the first second-stage amplification fixing rod 308 is coupled to the bottom of the first second-stage amplification output rod 310 by the first second-stage amplification fixing end hinge 309, and the top of the first first-stage amplification output rod 306 is coupled to the bottom of the first second-stage amplification output rod 310 by the first second-stage input end hinge 307; the first second-stage amplification output rod 310 is transversely arranged; the first second-stage amplification fixing end hinge 309 is on the right side of the first second-stage input end hinge 307, and the first second-stage input end hinge 307 is on the right side of the first first-stage amplification output rod 306; the top of the first second-stage amplification output rod 310 is coupled to the bottom of the first third-stage amplification output rod 314 by the first third-stage input end hinge 311; the first third-stage amplification fixing rod 312 is coupled to the first third-stage amplification fixing end hinge 313, which is coupled to the bottom of the first third-stage amplification output rod 314, and is located on the left side of the first third-stage input end hinge 311; the first output end hinge 315 is coupled to the top of the first third-stage amplification output rod 314, and is located on the right side; the first output end hinge 315 is coupled to the bottom of the first output end 316, and the first output end 316 is transversely arranged.

Figure 11:
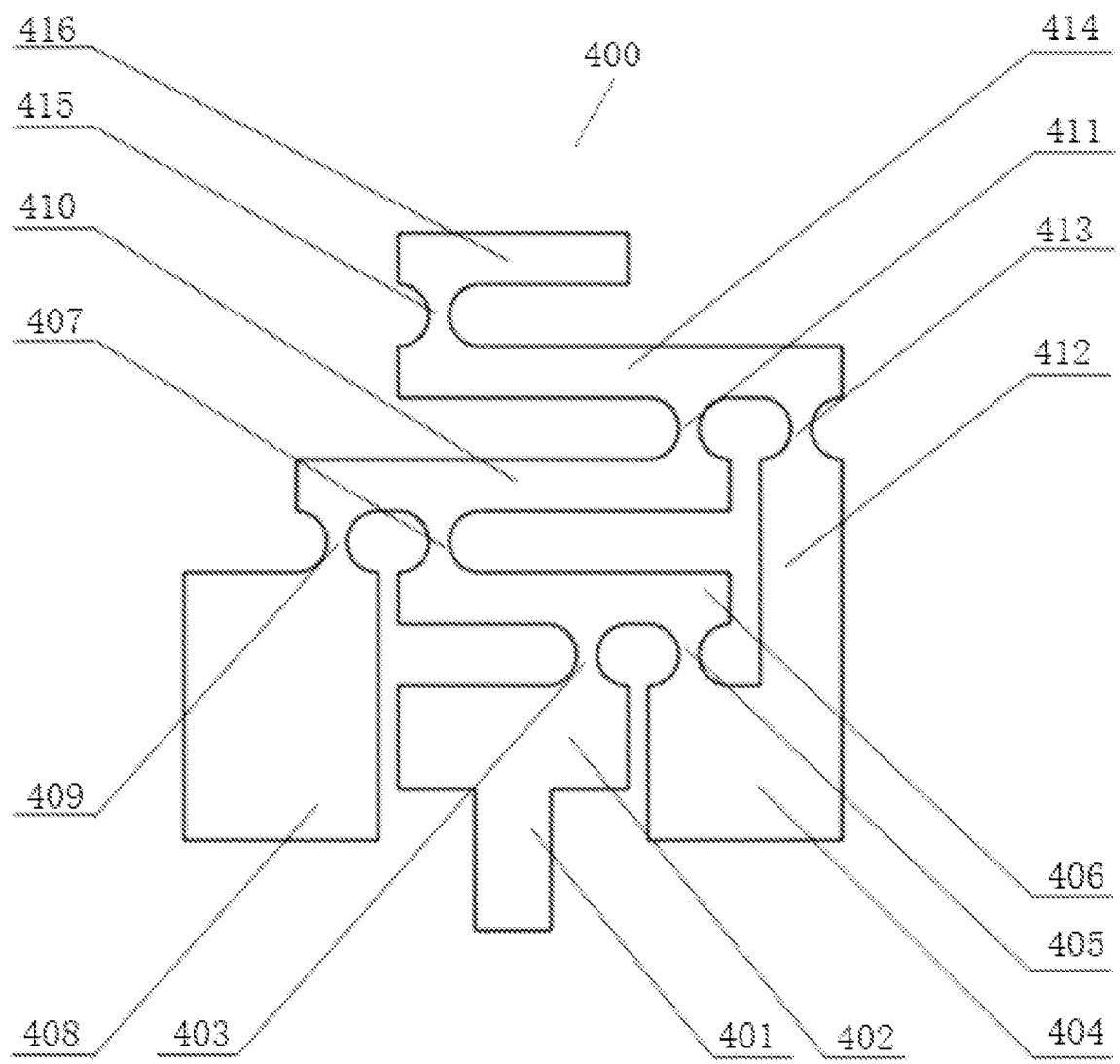
FIG. 11 is a view of the structure of a second asymmetrical three-stage amplifying structure in the present disclosure.

As shown in FIG. 11, it is a view of the structure of a second asymmetrical three-stage amplifying structure 400 in the present disclosure.

The second asymmetrical three-stage amplifying structure 400 adopts a three-stage amplification, and the structure thereof includes: a second input rod 401, a second input end 402, a second first-stage input end hinge 403, a second first-stage amplification fixing rod 404, and a second first-stage amplification fixing end hinge 405 and a second first-stage amplification output rod 406; a second second-stage input end hinge 407, a second second-stage amplification fixing rod 408, a second second-stage amplification fixing end hinge 409, a second second-stage amplification output rod 410, a second third-stage input end hinge 411, a second third-stage amplification fixing rod 412, a second third-stage amplification fixing end hinge 413, a second third-stage amplification output rod 414, a second output end hinge 415 and a second output end 416.

The second first-stage input end hinge 403, the second first-stage amplification fixing end hinge 405, the second second-stage input end hinge 407, the second second-stage amplification fixing end hinge 409, the second third-stage input end hinge 411, the second third-stage amplification fixing end hinge 413 and the second output end hinge 415 are flexible hinges.

The top of the second input end 402 is coupled to the bottom of the second first-stage amplification output rod 406 by the second first-stage input end hinge 403, and the top of the second first-stage amplification fixing rod 404 is coupled to the bottom of the second first-stage amplification output rod 406 by the second first-stage amplification fixing end hinge 405; the second first-stage amplification output rod 406 is transversely arranged, and the second first-stage amplification fixing rod 404 is on the right side of the second input end 402; the second first-stage input end hinge 403 and the second first-stage amplification fixing end hinge 405 are on the right side of the second first-stage amplification output rod 406; the top of the second second-stage amplification fixing rod 408 is coupled to the bottom of the second second-stage amplification output rod 410 by the second second-stage amplification fixing end hinge 409, and the top of the second first-stage amplification output rod 406 is coupled to the bottom of the second second-stage amplification output rod 410 by the second second-stage input end hinge 407; the second second-stage amplification output rod 410 is transversely arranged; the second second-stage amplification fixing end hinge 409 is on the left side of the second second-stage input end hinge 407, and the second second-stage input end hinge 407 is on the left side of the second first-stage amplification output rod 406; the second third-stage input end hinge 411 is coupled to the right side of the top of the second second-stage amplification output rod 410; the bottom of the second third-stage amplification output rod 414 is coupled to the second third-stage input end hinge 411; the second third-stage amplification fixing end hinge 413 is coupled to the bottom of the second third-stage amplification output rod 414, and located on the right end of the second third-stage input end hinge 411; the second third-stage amplification fixing end hinge 413 is coupled to the second third-stage amplification fixing rod 412, which is coupled to the second first-stage amplification fixing rod 404; the second output end hinge 415 is coupled to the right side of the top of the second third-stage amplification output rod 414; the bottom of the second output end 416 is coupled to the second output end hinge 415, and the second output end 416 is transversely arranged.

In the first asymmetrical three-stage amplifying structure 300 and the second asymmetrical three-stage amplifying structure 400, the first input rod 301 is fixed and coupled to the second input rod 401; the first input end 302 is fixed and coupled to the second input end 402; the first output end 316 is fixed and coupled to the second output end 416; the first first-stage amplification fixing rod 304, the first third-stage amplification fixing rod 312 and the second second-stage amplification fixing rod 408 are fixed and coupled; the first second-stage amplification fixing rod 308, the second first-stage amplification fixing rod 404 and the second third-stage amplification fixing rod 412 are fixed and coupled.

The amplification method of the three-stage micro-displacement amplifying apparatus comprises the following steps:

Step 1: The first input rod 301 and the second input rod 401 are coupled to the displacement output end of the magnetostrictive driver; the first first-stage amplification fixing rod 304, the first third-stage amplification fixing rod 312 and the second second-stage amplification fixing rod 408 are fixed and coupled; the first second-stage amplification fixing rod 308, the second first-stage amplification fixing rod 404 and the second third-stage amplification fixing rod 412 are fixed and coupled; all are coupled inside the magnetostrictive driver; the first input rod 301 transfers the micro-displacement input by the magnetostrictive driver to the first input end 302, and meanwhile, the second input rod 401 transfers the micro-displacement input by the magnetostrictive driver to the second input end 402.

Step 2: The first input end 302 transfers the displacement to the first first-stage input end hinge 303, which transfers the displacement to the first first-stage amplification output rod 306; meanwhile, the second input end 402 transfers the displacement to the second first-stage input end hinge 403, which transfers the displacement to the second first-stage amplification output rod 406; the first first-stage amplification output rod 306 deflects, and the right end moves upward; the second first-stage amplification output rod 406 deflects, and the left end moves upward.

The positions of the first first-stage amplification fixing rod 304 and the second first-stage amplification fixing rod 404 are fixed; the first first-stage amplification fixing rod 304 and the second first-stage amplification fixing rod 404 are fixed and immobilized; by using the principle of the lever, the first first-stage amplification fixing rod 304 functions to pull the end portion of the first first-stage amplification output rod 306 by the first first-stage amplification fixing end hinge 305; the first input end 302 pushes up and deflects the first first-stage amplification output rod 306 by the first first-stage input end hinge 303; the right end moves upward; the second first-stage amplification fixing rod 404 functions to pull the right end portion of the second first-stage amplification output rod 606 by the second first-stage amplification fixing end hinge 405; the second input end 402 pushes up the left end of the second first-stage amplification output rod 406 by the second first-stage input end hinge 403; the second first-stage amplification output rod 406 deflects; the left end moves upward.

The left arc opening of the first first-stage amplification fixing end hinge 305 and the first input end hinge 303 becomes smaller, while the right arc opening becomes larger; the left arc opening of the second first-stage amplification fixing end hinge 405 and the second input end hinge 403 becomes larger, while the right arc opening becomes smaller.

Step 3: The first first-stage amplification output rod 306 transfers the amplified displacement to the first second-stage input end hinge 307, which transfers the displacement to the first second-stage amplification output rod 310; the first second-stage amplification output rod 310 deflects, and the left end moves upward; the second first-stage amplification output rod 406 transfers the displacement to the second second-stage input end hinge 407, which transfers the displacement to the second second-stage amplification output rod 410; the second second-stage amplification output rod 410 deflects, and the right end moves upward.

The first second-stage amplification fixing rod 308 is fixed and immobilized, which functions to pull the end portion of the first second-stage amplification output rod 310 by the first second-stage amplification fixing end hinge 309; the first first-stage amplification output rod 306 pushes up the first second-stage amplification output rod 310 by the first second-stage input end hinge 307; the first second-stage amplification output rod 310 deflects, and the left end moves upward; the second second-stage amplification fixing rod 408 is fixed and immobilized, which functions to pull the end portion of the second second-stage amplification output rod 410 by the second second-stage amplification fixing end hinge 409; the second first-stage amplification output rod 406 pushes up the second second-stage amplification output rod 410 by the second second-stage output end hinge 407; the second second-stage amplification output rod 410 deflects, and the right end moves upward.

The left arc opening of the first second-stage input end hinge 307 and the first second-stage amplification fixing end hinge 309 becomes larger, while the right arc opening becomes smaller, so that the left end of the first second-stage amplification output rod 310 moves upward; the left arc opening of the second second-stage output end hinge 407 and the second second-stage amplification fixing end hinge 409 becomes smaller, while the right arc opening becomes larger, so that the right end of the second second-stage amplification output rod 410 moves upward.

Step 4: The first second-stage amplification output rod 310 transfers the amplified displacement to the first third-stage input end hinge 311, which transfers the amplified displacement to the first third-stage amplification output rod 314, and the first third-stage amplification output rod 314 transfers the displacement to the first output end hinge 315; meanwhile, the second second-stage amplification output rod 410 transfers the displacement to the second third-stage input end hinge 411, which transfers the amplified displacement to the second third-stage amplification output rod 414, and the second third-stage amplification output rod 414 transfers the displacement to the second output end hinge 415.

The left arc opening of the first third-stage input end hinge 311 and the first third-stage amplification fixing end hinge 313 becomes smaller, while the right arc opening becomes larger; the left arc opening of the second third-stage input end hinge 411 and the second third-stage amplification fixing end hinge 413 becomes larger, while the right arc opening becomes smaller.

The first first-stage amplification fixing rod 304, the first third-stage amplification fixing rod 312 and the second second-stage amplification fixing rod 408 are fixed and coupled; the first second-stage amplification fixing rod 308, the second first-stage amplification fixing rod 404 and the second third-stage amplification fixing rod 412 are fixed and coupled; under the action of force, the coupled first output end 316 and second output end 416 output an axially upward displacement, which eliminates the transverse displacement (of the first first-stage amplification output rod 306 and the second first-stage amplification output rod 406, the first second-stage amplification output rod 310 and the second second-stage amplification output rod 410, the first third-stage amplification output rod 314, the second third-stage amplification output rod 414, the first output end 316, the second output end 416), avoids the generation of a shear force, and effectively improves the axial output precision.

Step 5: The first output end hinge 315 transfers the displacement to the first output end 316, and the first output end 316 moves upward; the second output end hinge 415 transfers the displacement to the second output end 416, and the second output end 416 moves upward.

Figure 12:
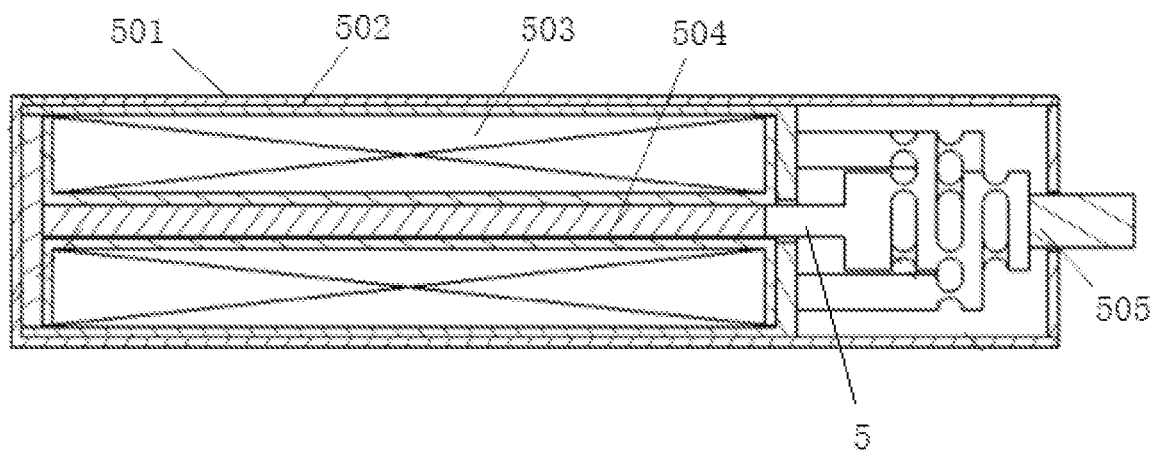
FIG. 12 is a view of the structure of a novel driver with a micro-displacement amplifying apparatus that provides an axial magnetic field from a rod in the present disclosure.

As shown in FIG. 12, it is a view of the structure of a novel driver with a micro-displacement amplifying apparatus that provides an axial magnetic field from a rod in the present disclosure.

The novel driver with a micro-displacement amplifying apparatus that provides an axial magnetic field from a rod comprises: a non-magnetic housing 501, a magnetic framework 502, an excitation coil 503, a first assembly 504 of magnetostrictive rods and a combined body of permanent magnets and conducting magnets, a two-stage micro-displacement amplifying apparatus and an output rod 505.

The excitation coil 503, sleeved outside the first assembly 504, is placed in the magnetic framework 502, and the magnetic framework 502 and the first assembly 504 forms a closed magnetic circuit; the magnetic framework 502 is arranged in the non-magnetic housing 501, and the non-magnetic housing 501 is used to constrain the magnetic framework 502; one end of the first assembly 504 is coupled to the magnetic framework 502, and the other end is coupled to the input rod 5 of the micro-displacement amplifying apparatus by the through-hole of the non-magnetic housing 502; the first assembly 504 is used to transfer the displacement to the micro-displacement amplifying apparatus; the amplification fixing rod 12 of the two-stage micro-displacement amplifying apparatus is coupled to the magnetic framework 502, and the amplification output rod 11 is coupled to the rear end of the output rod 505; the front end of the output rod 505 extends from the through-hole of the non-magnetic housing 501; the micro-displacement amplifying apparatus amplifies the displacement of the first assembly 504 and then transfers it to the output rod 505, which outputs the displacement.

The first assembly 504 comprises: a conducting magnet, a permanent magnet and a magnetostrictive rod; the magnet comprises a plurality of conducting magnet single bodies; the permanent magnet comprises a plurality of permanent magnet single bodies; the magnetostrictive rod comprises a plurality of magnetostrictive rod single bodies. The conducting magnet single bodies are respectively coupled to both sides of the permanent magnet single bodies to form magnet units, which are coupled to both sides of the magnetostrictive rod single bodies. The conducting magnet single bodies at the rear end are coupled to the magnetic framework 502, and the conducting magnet single bodies at the front end are coupled to the micro-displacement amplifying apparatus. The magnet units and the magnetostrictive rods are alternately distributed at intervals in the axial direction.

Figure 13:
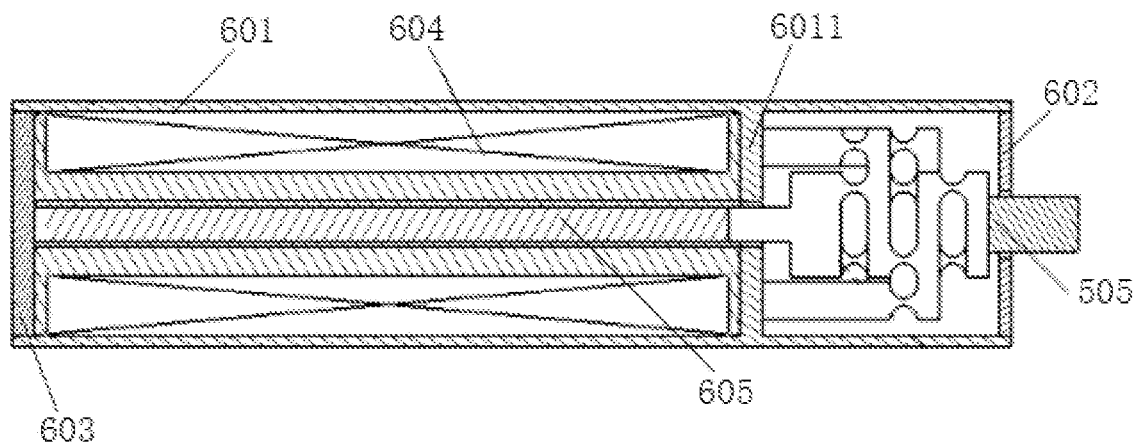
FIG. 13 is a view of the structure of a driver with a two-stage micro-displacement amplifying apparatus that provides an axial magnetic field from a framework in the present disclosure.

As shown in FIG. 13, it is a view of the structure of a driver with a two-stage micro-displacement amplifying apparatus that provides an axial magnetic field from a framework in the present disclosure.

The driver with a two-stage micro-displacement amplifying apparatus that provides an axial magnetic field from a framework comprises: an H-shape non-magnetic housing 601, an upper end cover 602, a lower end cover 603, a solenoid 604, a second assembly 605, a two-stage micro-displacement amplifying apparatus and an output rod 505.

The H-shape non-magnetic housing 601 has openings at both ends, and the inner wall is configured to have a baffle 6011, and the baffle 6011 is configured to have an input rod through-hole. The upper end cover 602 is coupled to the front end opening and is configured to have an output rod through-hole; the lower end cover 603 is coupled to the rear end opening; the solenoid 604 is installed in the H-shape non-magnetic housing 601 and located behind the baffle 6011 with the front end pressing against the baffle 6011 and the rear end pressing against the lower end cover 603; the solenoid 604 is configured to have an axial through-hole and sleeved with a coil 6043, with permanent magnets being disposed on the outer wall of the axial through-hole and forming an axial permanent magnetic field at the axial through-hole; the axial through-hole is in communication with the input rod through-hole, and the second assembly 605 is installed in the axial through-hole; the two-stage micro-displacement amplifying apparatus is installed in the H-shape non-magnetic housing 601, and located in the front of the baffle 6011; the input rod 5 of the two-stage micro-displacement amplifying apparatus extends into the input rod through-hole and is coupled to the end portion of the second assembly 605; one end of the output rod 505 is coupled to the output end (amplification output rod 11) of the two-stage micro-displacement amplifying apparatus, and the other end extends from the through-hole of the output rod.

The second assembly 605 is a combination of magnetostrictive rods and conducting magnets, which transfers the magnetostrictive displacement to the input rod 5 of the two-stage micro-displacement amplifying apparatus; the amplification fixing rods 12 of the two-stage micro-displacement amplifying apparatus is coupled to the baffle 6011; the two-stage micro-displacement amplifying apparatus amplifies the displacement and then transfers it to the output rod 505, which then outputs the displacement.

Figure 14:
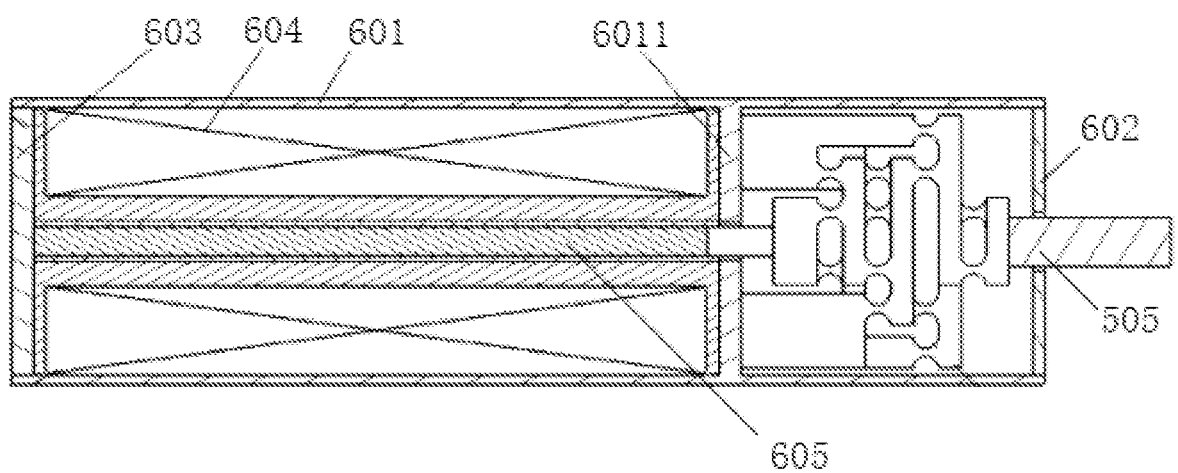
FIG. 14 is a view of the structure of a driver with a three-stage micro-displacement amplifying apparatus that provides an axial magnetic field from a framework in the present disclosure.

As shown in FIG. 14, it is a view of the structure of a driver with a three-stage micro-displacement amplifying apparatus that provides an axial magnetic field from a framework in the present disclosure.

The driver with a three-stage micro-displacement amplifying apparatus that provides an axial magnetic field from a framework comprises: an H-shape non-magnetic housing 601, an upper end cover 602, a lower end cover 603, a solenoid 604, a second assembly 605, a three-stage micro-displacement amplifying apparatus and an output rod 505.

The three-stage micro-displacement amplifying apparatus is installed in the H-shape non-magnetic housing 601, and located in the front of the baffle 6011; the input rod 5 of the three-stage micro-displacement amplifying apparatus extends into the input rod through-hole and is coupled to the end portion of the second assembly 605; one end of the output rod 505 is coupled to the output end (amplification output rod 11) of the three-stage micro-displacement amplifying apparatus, and the other end extends from the through-hole of the output rod. The second assembly 605 transfers the magnetostrictive displacement to the input rod 5 of the three-stage micro-displacement amplifying apparatus; the amplification fixing rods 12 of the three-stage micro-displacement amplifying apparatus is coupled to the baffle 6011; the two-stage micro-displacement amplifying apparatus amplifies the displacement and then transfers it to the output rod 505, which then outputs the displacement.

Figure 15:
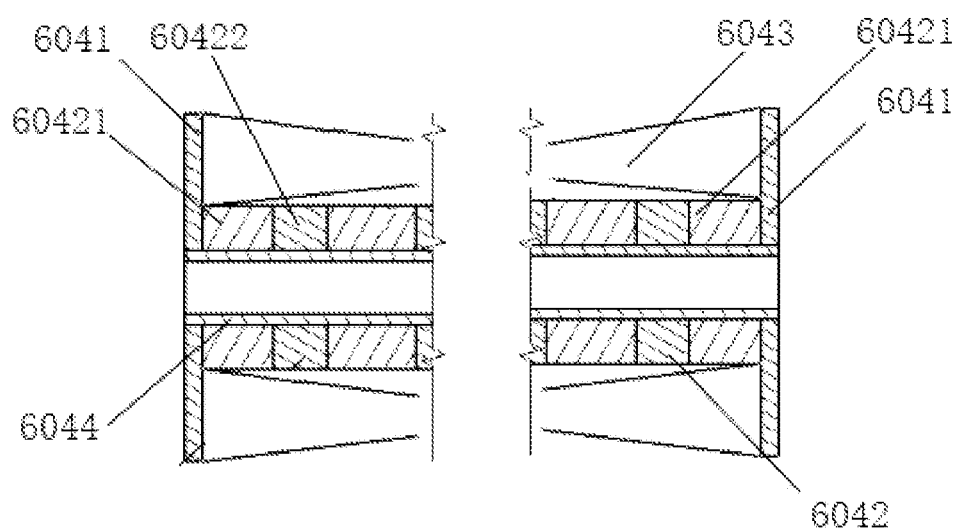
FIG. 15 is a view of the structure of a solenoid in the present disclosure.

As shown in FIG. 15, it is a view of the structure of the solenoid 604 in the present disclosure.

The solenoid 604 provides an axial permanent magnetic field (the solenoid originally provides an excitation magnetic field, and the one in the present disclosure can provide a bias magnetic field at the same time of providing an axial permanent magnetic field), which acts as the excitation magnetic field and the bias magnetic field for devices such as magnetostrictive brakes, drivers and the like.

The structure of the solenoid 604 comprises: a support end face 6041, a solenoid body 6042 and a coil 6043; the support end face 6041 is arranged at both ends of the solenoid body 6042, and the coil 6043 is arranged on the outer wall of the solenoid body 6042; the solenoid body 6042 is a tubular structure, and in order to enhance the heat insulation effect, a heat insulation layer 6044 is configured on the inner wall of the solenoid body 6042.

The solenoid body 6042 comprises: conducting magnets 60421 and permanent magnets 60422, which are of a ring structure; a plurality of conducting magnets 60421 and permanent magnets 60422 are alternately arranged at intervals, and connected at the contacting end faces. The plurality of conducting magnets 60421 and the permanent magnets 60422 are coaxially distributed and have the same inner diameter.

The structure of the solenoid body 6042 takes the axial center as the midpoint, and is a two-sided symmetrical structure. The coil 6043 is wound with enameled wire. There are at least two sets of permanent magnets 60422. The magnetic properties of the permanent magnets 60422 symmetrical on both sides of the center point are the same; the magnetic properties of the permanent magnets 60422 distributed from the midpoint to the two ends gradually decrease. There are more than 3 sets of conducting magnets, and the length of the conducting magnets 60421 distributed from the axial center point to the two ends gradually increases. The support end face 6041 is coupled to the conducting magnets 60421. The material of the heat insulation layer 44 is a non-magnetic material.

Figure 16:
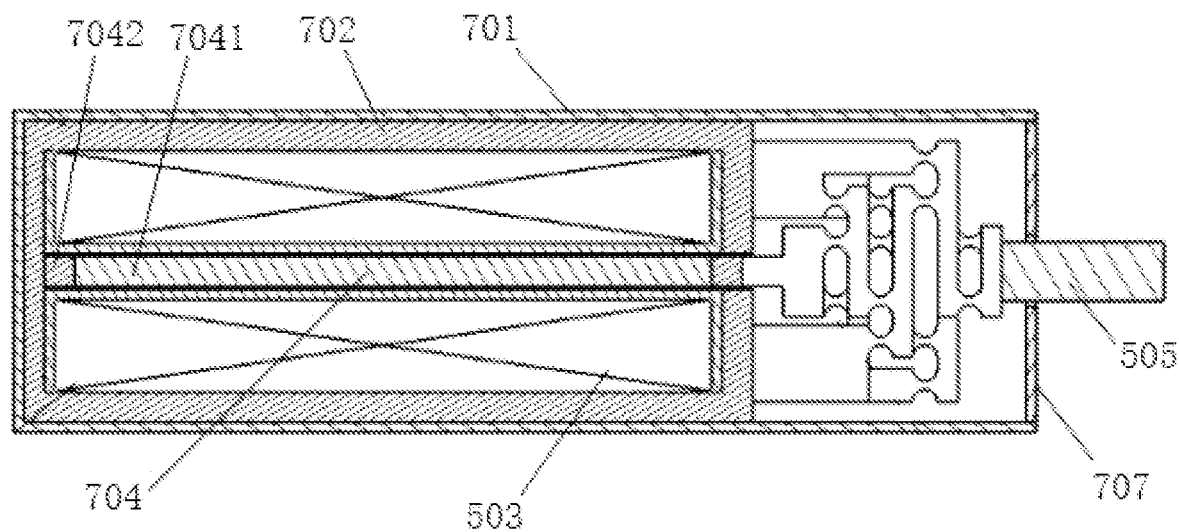
FIG. 16 is a view of the structure of a driver with a three-stage micro-displacement amplifying apparatus that provides an axial magnetic field from a housing in the present disclosure.

As shown in FIG. 16, it is a view of the structure of a driver with a two-stage micro-displacement amplifying apparatus that provides an axial magnetic field from a housing in the present disclosure.

The driver with a two-stage micro-displacement amplifying apparatus that provides an axial magnetic field from a housing comprises: a non-magnetic housing 701, a magnetic framework 702, an excitation coil 503, a third assembly 704, a two-stage micro-displacement amplifying apparatus, an output rod 505 and a non-magnetic upper end cover 707.

The non-magnetic housing 701 has an opening at one end, and the non-magnetic upper end cover 707 is arranged at the opening and has an output rod through-hole. The magnetic framework 702 has an input rod through-hole at the top, and forms an axial permanent magnetic field.

The excitation coil 503 comprises a coil housing and a winding, which is arranged outside the coil housing, and the coil housing has an axial through-hole.

The third assembly 704 comprises: a magnetostrictive rod 7041 and a first conducting magnet 7042; two conducting magnets 7042 are coupled to the magnetostrictive rod 7041 at both ends, respectively. The third assembly 704 is installed in the axial through-hole.

The two-stage micro-displacement amplifying apparatus (or three-stage micro-displacement amplifying apparatus) is installed in the non-magnetic housing 701 and located outside the magnetic framework 702; the input rod 5 extends into the axial through-hole and is coupled to the first framework conducting magnet 7042; one end of the output rod 505 is coupled to the output end (amplification output rod 11), and the other end extends from the through-hole of the output rod.

The magnetic framework 702 with an axial permanent magnetic field and the third assembly 704 forms a closed magnetic circuit. The third assembly 704 transfers the displacement to the two-stage micro-displacement amplifying apparatus; the fixing end (amplification output rod 12) of the two-stage micro-displacement amplifying apparatus is coupled to the magnetic framework 702; the two-stage micro-displacement amplifying apparatus amplifies the displacement and then transfers it to the output rod 505, which outputs the displacement.

Figure 17:
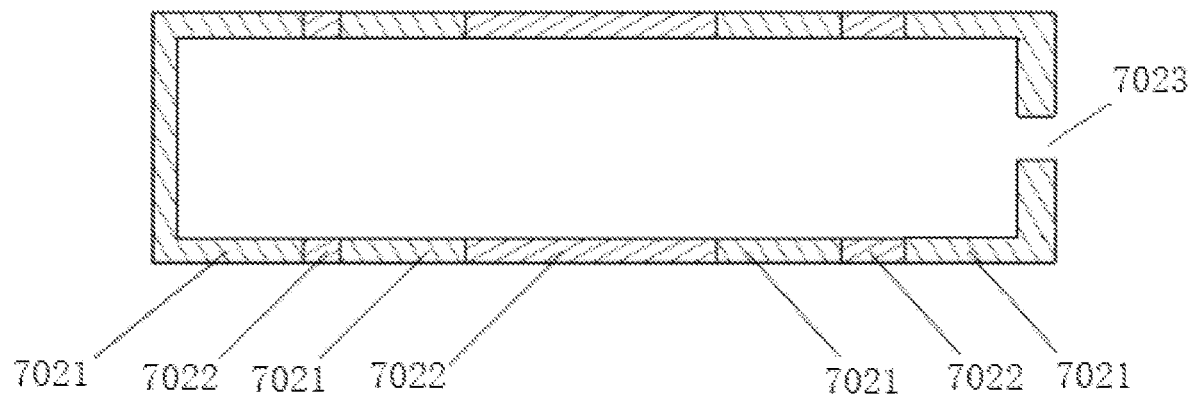
FIG. 17 is a view of the structure of a magnetic framework in the present disclosure.

As shown in FIG. 17, it is a view of the structure of a magnetic framework in the present disclosure.

The magnetic framework 702 comprises: a second framework conducting magnet 7021 and a second framework permanent magnet 7022; a plurality of second frame conducting magnets 7021 and framework permanent magnets 7022 are arranged at intervals and joined endwise; and an input rod through-hole 7023 is opened at the top of the second framework conducting magnet 7021 at the end portion. The number of the second framework conducting magnet 7021 and framework permanent magnet 7022 is at least two.

INDUSTRIAL APPLICABILITY

The present disclosure enables the micro-displacement amplifying apparatus to achieve a larger displacement magnification, and at the same time effectively avoids the space occupied by the part that is ineffective to the magnification effect in the traditional axisymmetrical structure, which not only eliminates the transverse displacement of the micro-displacement amplifying apparatus but also greatly reduces the volume of the micro-displacement amplifying apparatus, allowing for the miniaturization of the driver.

The terms used in the present disclosure are illustrative and exemplary rather than restrictive terms. Since the present disclosure can be specifically carried out in various forms without departing from the spirit or essence of the disclosure, it should be understood that the above-mentioned examples are not limited to any of the foregoing details, but should be interpreted broadly within the spirit and scope defined by the appended claims. Therefore, all changes and modifications falling within the scope of the claims or their equivalents shall be encompassed by the appended claims.

What is claimed is:

1. A micro-displacement amplifying apparatus, comprising two sets of asymmetrical amplifying structures and a driver; wherein each set of asymmetrical amplifying structure comprises a plurality of asymmetrical amplifying units connected in series by flexible hinges; the asymmetrical amplifying units are of non-axisymmetrical structure for amplifying a micro-displacement and comprise: an amplification output rod, an amplification fixing rod, an input end hinge and an amplification fixing end hinge; the amplification fixing rod is coupled to a lower part of the amplification output rod by the amplification fixing end hinge, which is located near an end portion of the amplification output rod, functioning to pull the end portion of the amplification output rod; the input end hinge is arranged at the lower part of the amplification output rod, and is located in an inner side of the amplification fixing end hinge, functioning to support the amplification output rod; the input end hinge and the amplification fixing end hinge are flexible hinges; two sets of asymmetrical amplifying structures are in opposite positions and overlap with each other; two contacting input ends are fixed and coupled to each other, and two contacting output ends are fixed and coupled to each other; the input end is coupled to the input end hinge to input the micro-displacement; the output end is coupled to the amplification output rod to output an amplified displacement.

2. The micro-displacement amplifying apparatus according to claim 1, wherein the asymmetrical amplifying structure is an asymmetrical two-stage amplifying structure, and the asymmetrical two-stage amplifying structure comprises two asymmetrical amplifying units, which are a first-stage amplifying unit and a second-stage amplifying unit, respectively; the asymmetrical amplifying unit comprises: an amplification output rod, an amplification fixing rod, an input end hinge, an amplification fixing end hinge; the amplification output rod is transversely arranged; the amplification fixing rod is coupled to the lower part of the amplification output rod by the amplification fixing end hinge, which is located near the end portion of the amplification output rod; the input end hinge is arranged at the lower part of the amplification output rod, and is located in the inner side of the amplification fixing end hinge; the input end hinge of the first-stage amplifying unit is coupled to the input end, and the second-stage amplifying unit is coupled to a top of the amplification output rod of the first-stage amplifying unit by the input end hinge; the top of the amplification output rod of a second-stage amplifier unit is coupled to the output end by an output end hinge, and the output end is transversely arranged; the input end hinge, the amplification fixing end hinge and the output end hinge are flexible hinges; the two sets of asymmetrical two-stage amplifying apparatuses are in opposite positions and overlap with each other, and two contacting amplification fixing rods are coupled to each other.

3. The micro-displacement amplifying apparatus according to claim 1, wherein the asymmetrical amplifying structure is an asymmetrical three-stage amplifying structure, and the asymmetrical three-stage amplifying structure comprises three asymmetrical amplifying units, which are a first-stage amplifying unit, a second-stage amplifying unit and a third-stage amplifying unit, respectively; the asymmetrical amplifying unit comprises: an amplification output rod, an amplification fixing rod, an input end hinge and an amplification fixing end hinge; the amplification output rod is transversely arranged, and the amplification fixing rod is coupled to the lower part of the amplification output rod by the amplification fixing end hinge, which is located near the end portion of the amplification output rod; the input end hinge is arranged at the lower part of the amplification output rod, and is located in the inner side of the amplification fixing end hinge; the input end hinge of the first-stage amplifying unit is coupled to the input end; the second-stage amplifying unit is coupled to the top of the amplification output rod of the first-stage amplifying unit by the input end hinge; the third-stage amplifying unit is coupled to the top of the amplification output rod of the second-stage amplifying unit by the input end hinge; the top of the third-stage amplifying unit is coupled to the output end by the output end hinge, and the output end is transversely arranged; the input end hinge, the amplification fixing end hinge and the output end hinge are flexible hinges; two sets of asymmetrical three-stage amplifying apparatuses are in opposite positions and overlap with each other, and the two contacting amplification fixing rods are coupled to each other.

4. The micro-displacement amplifying apparatus according to claim 3, wherein the amplification fixing rod of the third-stage amplifying unit is coupled to the amplification fixing rod of the first-stage amplifying unit.

5. The micro-displacement amplifying apparatus according to claim 1, wherein the input end is configured to have an input rod, and the amplification fixing rods are located on both sides of the input end.

6. The micro-displacement amplifying apparatus according to claim 2, wherein the magnification is adjusted by adjusting a position of the input end hinge of each asymmetrical amplifying unit on the amplification output rod.

7. The micro-displacement amplifying apparatus according to claim 1, wherein the driver comprises: a non-magnetic housing, a magnetic framework, an excitation coil, an assembly and an output rod; the excitation coil, sleeved outside first assembly, is placed in the magnetic framework, and the magnetic framework and the first assembly forms a closed magnetic circuit; the magnetic framework is arranged in the non-magnetic housing, and the non-magnetic housing is used to constrain the magnetic framework; one end of the first assembly is coupled to the magnetic framework, and another end is coupled to the input rod of the micro-displacement amplifying apparatus that is located in the non-magnetic housing; the assembly is used to transfer the displacement to the micro-displacement amplifying apparatus; the fixing end of the micro-displacement amplifying apparatus is coupled to the magnetic framework, and the output end is coupled to rear end of the output rod; front end of the output rod extends from a through-hole of the non-magnetic housing; the micro-displacement amplifying apparatus amplifies the displacement of the first assembly and transfers it to the output rod, and the output rod is used to output the displacement.

8. The micro-displacement amplifying apparatus according to claim 7, wherein the assembly comprises: a conducting magnet, a permanent magnet and a magnetostrictive rod; the permanent magnet comprises a plurality of conducting magnet single bodies; the permanent magnet comprises a plurality of permanent magnet single bodies; the magnetostrictive rod comprises a plurality of magnetostrictive rod single bodies; the conducting magnet single bodies are respectively coupled to both sides of the permanent magnet single bodies to form magnet units, which are coupled to both sides of the magnetostrictive rod single bodies; the conducting magnet single bodies at the rear end are coupled to the magnetic framework, and the conducting magnet single bodies at the front end are coupled to the micro-displacement amplifying apparatus; the magnet units and the magnetostrictive rods are alternately distributed at intervals in an axial direction.

9. The micro-displacement amplifying apparatus according to claim 1, wherein the driver comprises: a non-magnetic housing, a magnetic framework, an excitation coil, an assembly, an output rod and a non-magnetic upper end cover; the non-magnetic housing has an opening at one end, and the non-magnetic upper end cover is arranged at the opening and has an output rod through-hole; the magnetic framework has an input rod through-hole at the top, and forms an axial permanent magnetic field; the excitation coil comprises a coil housing and a winding, which is arranged outside the coil housing, and the coil housing has an axial through-hole; the assembly comprises: a magnetostrictive rod and conducting magnets; two conducting magnets are coupled to the magnetostrictive rod at both ends, respectively; the assembly is installed in the axial through-hole; the micro-displacement amplifying apparatus is installed in the non-magnetic housing and located outside the magnetic framework; an input rod extends into the axial through-hole and is coupled to the conducting magnet; one end of the output rod is coupled to the output end, and the other end extends from the through-hole of the output rod.

10. The micro-displacement amplifying apparatus according to claim 1, wherein the driver comprises: an H-shape non-magnetic housing, an upper end cover, a lower end cover, a solenoid, an assembly and an output rod; the H-shape non-magnetic housing has openings at both ends, and inner wall is configured to have a baffle, and the baffle has an input rod through-hole; the upper end cover is coupled to the front end opening and is configured to have an output rod through-hole; the lower end cover is coupled to a rear end opening; the solenoid is installed in the H-shape non-magnetic housing and located behind the baffle with a front end pressing against the baffle and a rear end pressing against the lower end cover; the solenoid is configured to have an axial through-hole and a coil, with permanent magnets being disposed on an outer wall of the axial through-hole; the axial through-hole is in communication with the input rod through-hole, and the assembly is installed in the axial through-hole; the micro-displacement amplifying apparatus is installed in the H-shape non-magnetic housing, and located in a front of the baffle; a displacement input rod of the micro-displacement amplifying apparatus extends into the input rod through-hole and is coupled to the end portion of the assembly; one end of the output rod is coupled to the output end of a two-stage micro-displacement amplifying apparatus, and another end extends from the through-hole of the output rod.

11. The micro-displacement amplifying apparatus according to claim 10, wherein the solenoid comprises: a support end face, a solenoid body and a coil; the support end face is arranged at both ends of the solenoid body, and the coil is arranged on the outer wall of the solenoid body; the solenoid body comprises: conducting magnets and permanent magnets, which are of a ring structure; a plurality of conducting magnets and permanent magnets are alternately arranged at intervals, and connected at the contacting end faces.

12. The micro-displacement amplifying apparatus according to claim 10, wherein the axial through-hole is configured to have a heat insulation layer; the solenoid body is a tubular structure; the permanent magnets are at least two sets; and the conducting magnets are at least three sets.

13. The micro-displacement amplifying apparatus according to claim 7, wherein the asymmetrical amplifying structure is an asymmetrical two-stage amplifying structure or an asymmetrical three-stage amplifying structure.

14. An amplification method of a micro-displacement amplifying apparatus, comprising:
transferring a micro-displacement input by a magnetostrictive driver to an input end;
transferring the micro-displacement to a flexible hinge by the input end on one side of the input end of a first-stage asymmetrical amplifying unit;
fixing and immobilizing an amplification fixing rod of the asymmetrical amplifying unit at each stage;
pulling an end portion of an amplification output rod by the amplification fixing rod through the flexible hinge which is coupled to the amplification output rod;
pushing up the amplification output rod by the flexible hinge which is coupled to the input end and the amplification output rod, so that the end portion of the amplification output rod moves upward;
making the amplification output rods of overlapping asymmetrical amplifying units be deflected simultaneously to complete displacement amplification; and
transferring an amplified micro-displacement to a next-stage asymmetrical amplifying unit, or outputting the amplified micro-displacement through an output end.

15. The amplification method of the micro-displacement amplifying apparatus according to claim 14, wherein the asymmetrical amplifying structure is selected from an asymmetrical two-stage amplifying structure; the asymmetrical two-stage amplifying structure comprises two asymmetrical amplifying units, which are a first-stage amplifying unit and a second-stage amplifying unit; the amplification fixing rod of the first-stage amplifying unit is fixed and immobilized, and functions to pull the end portion of the amplification output rod of the first-stage amplifying unit by the amplification fixing end hinge of the first-stage amplifying unit; the amplification fixing rod of the second-stage amplifying unit is fixed and immobilized, and functions to pull the end portion of the amplification output rod of the second-stage amplifying unit by the amplification fixing end hinge of the second-stage amplifying unit; the input end pushes up the amplification output rod of the first-stage amplifying unit by the input end hinge of the first-stage amplifying unit; the amplification output rod of the first-stage amplifying unit pushes up the amplification output rod of the second-stage amplifying unit by the input end hinge of the second-stage amplifying unit; the amplification fixing end hinge and input end hinge are flexible hinges.

16. The amplification method of the micro-displacement amplifying apparatus according to claim 14, wherein the asymmetrical amplifying structure is selected from an asymmetrical three-stage amplifying structure, and the asymmetrical three-stage amplifying structure comprises three asymmetrical amplifying units, which are a first-stage amplifying unit, a second-stage amplifying unit and a third-stage amplifying unit, respectively; the amplification fixing rod of the first-stage amplifying unit is fixed and immobilized, and functions to pull the end portion of the amplification output rod of the first-stage amplifying unit by the amplification fixed end hinge of the first-stage amplifying unit; the amplification fixing rod of the second-stage amplifying unit is fixed and immobilized, and functions to pull the end portion of the amplification output rod of the second-stage amplifying unit by the amplification fixing end hinge of the second-stage amplifying unit; the amplification fixing rod of the third-stage amplifying unit is fixed and immobilized, and functions to pull the end portion of the amplification output rod of the third-stage amplifying unit by the amplification fixing end hinge of the third-stage amplifying unit; the input end pushes up the amplification output rod of the first-stage amplifying unit by the input end hinge of the first-stage amplifying unit; the amplification output rod of the first-stage amplifying unit pushes up the amplification output rod of the second-stage amplifying unit by the input end hinge of the second-stage amplifying unit; the amplification output rod of the second-stage amplifying unit pushes up the amplification output rod of the third-stage amplifying unit by the input end hinge of the third-stage amplifying unit; the amplification fixing end hinge and the input end hinge are flexible hinges.

\* \* \* \* \*